US012022702B2

United States Patent
Sun et al.

(10) Patent No.: US 12,022,702 B2
(45) Date of Patent: *Jun. 25, 2024

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Kaipeng Sun, Beijing (CN); Weiyun Huang, Beijing (CN); Binyan Wang, Beijing (CN); Chao Wu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 64 days.

This patent is subject to a terminal disclaimer.

(21) Appl. No.: 17/851,653

(22) Filed: Jun. 28, 2022

(65) Prior Publication Data
US 2022/0328607 A1    Oct. 13, 2022

Related U.S. Application Data

(63) Continuation of application No. 17/280,364, filed as application No. PCT/CN2020/090539 on May 15, 2020.

(51) Int. Cl.
*H10K 59/131*    (2023.01)
*H10K 59/121*    (2023.01)
(Continued)

(52) U.S. Cl.
CPC ......... *H10K 59/131* (2023.02); *H10K 59/121* (2023.02); *H10K 59/1201* (2023.02);
(Continued)

(58) Field of Classification Search
CPC ..... H10K 59/131; H10K 59/121; H10K 59/65
See application file for complete search history.

(56) References Cited

U.S. PATENT DOCUMENTS 10,756,136 B1 *   8/2020   Ma .................. H01L 31/147
2016/0204094 A1   7/2016   Yang et al.
(Continued)

FOREIGN PATENT DOCUMENTS

CN    110061014 A    7/2019
CN    110288915 A *  9/2019    ......... G06K 9/00013
(Continued)

OTHER PUBLICATIONS

Machine translation of CN-110288915-A (Year: 2019).*
(Continued)

*Primary Examiner* — Xuemei Zheng
(74) *Attorney, Agent, or Firm* — Muncy, Geissler, Olds & Lowe, P.C.

(57) ABSTRACT

A display panel and a display device are provided. In a second pixel region of the display panel, there is a second gap between a third electrical connection element and a fourth electrical connection element in a second electrical connection layer, a third electrical connection layer is coupled to a fifth signal line pattern included in each sub-pixel of a corresponding sub-pixel group. The fifth signal line pattern is used to transmit a fifth signal with a fixed electrical potential, and an orthographic projection of the third electrical connection layer onto a substrate of the display panel covers at least part of an orthographic projection of the second gap onto the substrate.

9 Claims, 12 Drawing Sheets

(51) Int. Cl.
  *H10K 59/12*    (2023.01)
  *H10K 59/65*    (2023.01)
  *H10K 71/00*    (2023.01)
(52) U.S. Cl.
  CPC ......... *H10K 59/1216* (2023.02); *H10K 59/65* (2023.02); *H10K 71/00* (2023.02)

(56) References Cited

U.S. PATENT DOCUMENTS

2020/0043990 A1    2/2020  Huangfu et al.
2022/0045157 A1*   2/2022  Sun .................... H10K 59/121

FOREIGN PATENT DOCUMENTS

| CN | 110600531 A | 12/2019 |
| CN | 110634930 A | 12/2019 |
| CN | 110854178 A | 2/2020 |
| CN | 110874990 A | 3/2020 |

OTHER PUBLICATIONS

International Search Report and Written Opinion of PCT/CN2020/090539 with English translations, dated Feb. 28, 2021, 13 pages.

* cited by examiner

DISPLAY PANEL AND DISPLAY DEVICE

CROSS-REFERENCE TO RELATED APPLICATION

This application is a continuation application of U.S. patent application Ser. No. 17/280,364 filed on Mar. 26, 2021, which is the U.S. national phase of PCT Application No. PCT/CN2020/090539 filed on May 15, 2020, the entire contents of which are incorporated herein by reference in their entireties.

TECHNICAL FIELD

The present disclosure relates to the field of display technologies, in particular to a display panel and a display device.

BACKGROUND

With consumers' increasing demand for screen integrity, disposing a camera under a display screen has been increasingly popular. This under-screen camera technique mainly includes disposing a camera within a display area of a display screen and under pixel units, so that both the display function of the display panel and a camera function of the camera can be achieved by reducing pixel density of the area where the camera is located.

SUMMARY

An objective of the present disclosure is to provide a display panel and a display device.

According to a first aspect of the present disclosure, a display panel is provided. The display panel includes a first pixel region and a second pixel region, where a pixel density of the second pixel region is lower than a pixel density of the first pixel region; the second pixel region includes a plurality of pixel units arranged in array, the plurality of pixel units form a plurality of rows of pixel units, and each row of pixel units includes a plurality of pixel units arranged in a first direction; each of the plurality of pixel units includes a plurality of sub-pixels arranged in the first direction, and two sub-pixels that are closest to each other and belong respectively to two adjacent pixel units in a same row of pixel units form a sub-pixel group; the sub-pixel includes: a sub-pixel driver circuit, and a first signal line pattern to a fifth signal line pattern coupled to the sub-pixel driver circuit;

the display panel further includes a plurality of electrical connection structures corresponding to the sub-pixel groups respectively, where each of the plurality of electrical connection structures is between two sub-pixels included in a corresponding one of the sub-pixel groups, and the electrical connection structure includes a first electrical connection layer, a second electrical connection layer and a third electrical connection layer disposed in different layers;

the first electrical connection layer includes a first electrical connection element and a second electrical connection element, and there is a first gap between the first electrical connection element and the second electrical connection element; the first electrical connection element is coupled to the first signal line pattern included in each sub-pixel in the corresponding sub-pixel group, and the second electrical connection element is coupled to the second signal line pattern included in each sub-pixel in the corresponding sub-pixel group;

the second electrical connection layer includes a third electrical connection element and at least one fourth electrical connection element, and there is a second gap between the third electrical connection element and the fourth electrical connection element that are adjacent; the third electrical connection element is coupled to the third signal line pattern included in each sub-pixel in the corresponding sub-pixel group, the at least one fourth electrical connection element respectively corresponds to the fourth signal line patterns included in the two sub-pixels in the corresponding sub-pixel group, and each of the at least one fourth electrical connection element is coupled to a corresponding one of the fourth signal line patterns;

the third electrical connection layer is coupled to the fifth signal line pattern included in each sub-pixel in the corresponding sub-pixel group, the fifth signal line pattern is used to transmit a fifth signal with a fixed electrical potential, and an orthographic projection of the third electrical connection layer onto a substrate of the display panel covers at least part of an orthographic projection of the first gap onto the substrate and at least part of an orthographic projection of the second gap onto the substrate.

Optionally, the first signal line pattern includes a first reset signal line pattern, and at least part of the first reset signal line pattern extends in the first direction; the second signal line pattern includes a light emission control signal line pattern, and at least part of the light emission control signal line pattern extends in the first direction.

Optionally, the third signal line pattern includes a gate line pattern and a second reset signal line pattern that are arranged in a second direction, at least part of the gate line pattern and at least part of the second reset signal line pattern respectively extend in the first direction, and the gate line pattern and the second reset signal line pattern are used to transmit a same third signal;

the third electrical connection element includes a first portion, a second portion and a third portion, the first portion and second portion extend in the second direction, the third portion extends in the first direction, and the second direction and the first direction intersect; the first portion is coupled to the gate line pattern and the second reset signal line pattern included in one sub-pixel in the sub-pixel group, the second portion is coupled to the gate line pattern and the second reset signal line pattern included in the other sub-pixel in the sub-pixel group, and the third portion is coupled to the first portion and the second portion.

Optionally, the fourth signal line pattern includes two initialization signal line patterns arranged in a second direction, the second direction and the first direction intersect, the second electrical connection layer includes two fourth electrical connection elements, the two fourth electrical connection elements are in a one-to-one correspondence with the initialization signal line patterns included in each sub-pixel in the corresponding sub-pixel group, and each of the fourth electrical connection elements is coupled to the corresponding fourth signal line pattern;

at least part of an orthographic projection of the third electrical connection element onto the substrate is between orthographic projections of the two fourth electrical connection elements onto the substrate.

Optionally, the sub-pixel driver circuit includes a storage capacitor, the storage capacitor includes a first electrode plate and a second electrode plate arranged oppositely, and the first electrode plate is between the substrate and the second electrode plate;

the fifth signal line pattern includes a power signal line pattern, at least part of the power signal line pattern extends in the second direction, the second electrode plate and the power signal line pattern in the same sub-pixel are coupled to each other;

the third electrical connection layer is coupled to the second electrode plate included in each sub-pixel in the corresponding sub-pixel group.

Optionally, an orthographic projection of the first electrical connection element onto the substrate overlaps with an orthographic projection of the third electrical connection element onto the substrate and an orthographic projection of one of the two fourth electrical connection elements onto the substrate; and/or, an orthographic projection of the second electrical connection element onto the substrate overlaps with an orthographic projection of the third electrical connection element onto the substrate and an orthographic projection of the other one of the two fourth electrical connection elements onto the substrate.

Optionally, each of the first electrical connection element, the second electrical connection element, and the fourth electrical connection elements includes a first side portion, a second side portion and a middle portion between the first side portion and the second side portion; the middle portion extends in the first direction, the first side portion includes a portion extending in the first direction and a portion extending in the second direction, and the second side portion includes a portion extending in the first direction and a portion extending in the second direction;

an orthographic projection of the middle portion included in one of the two fourth electrical connection elements onto the substrate, an orthographic projection of the middle portion included in the first electrical connection element onto the substrate, an orthographic projection of a third portion of the third electrical connection element onto the substrate, an orthographic projection of the middle portion included in the second electrical connection element onto the substrate, and an orthographic projection of the middle portion included in the other one of the two fourth electrical connection elements onto the substrate are sequentially arranged in the second direction.

Optionally, the sub-pixel driver circuit includes a storage capacitor, the storage capacitor includes a first electrode plate and a second electrode plate arranged oppositely in a direction perpendicular to the substrate, and the first electrode plate is between the substrate and the second electrode plate;

the fourth signal line pattern includes a power signal line pattern, at least part of the power signal line pattern extends in a second direction, and the second electrode plate and the power signal line pattern are coupled to each other;

the second electrical connection layer includes one fourth electrical connection element, and the fourth electrical connection element is coupled to the second electrode plate included in each sub-pixel in the corresponding sub-pixel group.

Optionally, the fifth signal line pattern includes two initialization signal line patterns arranged in the second direction, and the third electrical connection layer is coupled to the initialization signal line patterns included in each sub-pixel in the corresponding sub-pixel group.

Optionally, an orthographic projection of the fourth electrical connection element onto the substrate is between an orthographic projection of the first electrical connection element onto the substrate and an orthographic projection of the second electrical connection element onto the substrate; and an orthographic projection of the third electrical connection element onto the substrate overlaps with the orthographic projection of the second electrical connection element onto the substrate.

Optionally, an orthographic projection of the fourth electrical connection element onto the substrate overlaps with an orthographic projection of the first electrical connection element onto the substrate and an orthographic projection of the second electrical connection element onto the substrate.

Optionally, an orthographic projection of the fourth electrical connection element onto the substrate overlaps with an orthographic projection of the first electrical connection element onto the substrate; and an orthographic projection of the third electrical connection element onto the substrate overlaps with an orthographic projection of the second electrical connection element onto the substrate.

Optionally, each of the first electrical connection element, the second electrical connection element, and the fourth electrical connection elements includes a first side portion, a second side portion and a middle portion between the first side portion and the second side portion; the middle portion extends in the first direction, the first side portion includes a portion extending in the first direction and a portion extending in the second direction, and the second side portion includes a portion extending in the first direction and a portion extending in the second direction;

the first gap is between the middle portion of the first electrical connection element and the middle portion of the second electrical connection element, the first gap has a first width in a direction perpendicular to the first direction, and the first width is a minimum width satisfying an insulation condition between the middle portion of the first electrical connection element and the middle portion of the second electrical connection element;

the second gap is between the middle portion of the third electrical connection element and the middle portion of the fourth electrical connection element, the second gap has a second width in a direction perpendicular to the first direction, and the second width is a minimum width satisfying an insulation condition between the middle portion of the third electrical connection element and the middle portion of the fourth electrical connection element.

Optionally, the orthographic projection of the third electrical connection layer onto the substrate overlaps with an orthographic projection of the first electrical connection element onto the substrate, an orthographic projection of the second electrical connection element onto the substrate, an orthographic projection of the third electrical connection element onto the substrate, and an orthographic projection of the fourth electrical connection element onto the substrate.

Optionally, each of the first electrical connection element, the second electrical connection element, and the fourth electrical connection elements includes a first side portion, a second side portion and a middle portion between the first side portion and the second side portion; the middle portion extends in the first direction, the first side portion includes a portion extending in the first direction and a portion extending in the second direction, and the second side portion includes a portion extending in the first direction and a portion extending in the second direction;
an orthographic projection of the middle portion included in the fourth electrical connection element onto the substrate, an orthographic projection of the middle portion included in the first electrical connection element onto the substrate, an orthographic projection of a third portion of the third electrical connection element onto the substrate, and an orthographic projection of the middle portion included in the second electrical connection element onto the substrate are all within the orthographic projection of the third electrical connection layer onto the substrate.

Optionally, the sub-pixel further includes a data line pattern extending in a second direction; the sub-pixel driver circuit includes a transistor structure and a storage capacitor, and the storage capacitor includes a first electrode plate and a second electrode plate arranged oppositely;
the first electrical connection layer and a gate electrode of the transistor structure are arranged in a same layer and are made of a same material;
the second electrical connection layer and the data line pattern are arranged in a same layer and are made of a same material;
the third electrical connection layer and the second electrode plate are arranged in a same layer and are made of a same material.

Optionally, the sub-pixel further includes a data line pattern extending in a second direction; the sub-pixel driver circuit includes a transistor structure and a storage capacitor, and the storage capacitor includes a first electrode plate and a second electrode plate arranged oppositely;
the first electrical connection layer and the second electrode plate are arranged in a same layer and are made of a same material;
the second electrical connection layer and the data line pattern are arranged in a same layer and are made of a same material;
the third electrical connection layer and a gate electrode of the transistor structure are arranged in a same layer and are made of a same material.

Optionally, the first signal line pattern includes a first reset signal line pattern, the second signal line pattern includes a light emission control signal line pattern, and the third signal line pattern includes a gate line pattern and a second reset signal line pattern; the sub-pixel further includes a power signal line pattern, a data line pattern, a first initialization signal line pattern and a second initialization signal line pattern;
the sub-pixel driver circuit includes: a storage capacitor, a driver transistor, a first transistor, a second transistor, a fourth transistor, a fifth transistor, a sixth transistor and a seventh transistor;
a gate electrode of the driver transistor is coupled to a second electrode of the first transistor, a first electrode of the driver transistor is coupled to a second electrode of the fifth transistor, a second electrode of the driver transistor is coupled to a first electrode of the first transistor;
a gate electrode of the first transistor is coupled to the gate line pattern;
a gate electrode of the second transistor is coupled to the first reset signal line pattern, a first electrode of the second transistor is coupled to the first initialization signal line pattern, a second electrode of the second transistor is coupled to the gate electrode of the driver transistor;
a gate electrode of the fourth transistor is coupled to the gate line pattern, a first electrode of the fourth transistor is coupled to the data line pattern, a second electrode of the fourth transistor is coupled to the first electrode of the driver transistor;
a gate electrode of the fifth transistor is coupled to the light emission control signal line pattern, a first electrode of the fifth transistor is coupled to the power signal line pattern;
a gate electrode of the sixth transistor is coupled to the light emission control signal line pattern, a first electrode of the sixth transistor is coupled to the second electrode of the driver transistor, a second electrode of the sixth transistor is coupled to a corresponding light emitting device in the display panel;
a second electrode of the seventh transistor is coupled to the corresponding light emitting device, a gate electrode of the seventh transistor is coupled to the second reset signal line pattern, a first electrode of the seventh transistor is coupled to the second initialization signal line pattern.

Based on the foregoing technical solution of the display panel, a second aspect of the present disclosure provides a display device including the foregoing display panel.

Based on the foregoing technical solution of the display panel, a third aspect of the present disclosure provides a method for manufacturing a display panel including a first pixel region and a second pixel region, a pixel density of the second pixel region being lower than a pixel density of the first pixel region, where the method includes:
manufacturing a plurality of pixel units arranged in array and a plurality of electrical connection structures in the second pixel region;
where the plurality of pixel units form a plurality of rows of pixel units and each row of pixel units includes a plurality of pixel units arranged in a first direction; each of the pixel units includes a plurality of sub-pixels arranged in the first direction, and two sub-pixels that are closest to each other and belong respectively to two adjacent pixel units in a same row of pixel units form a sub-pixel group; the sub-pixel includes: a sub-pixel driver circuit, and a first signal line pattern to a fifth signal line pattern coupled to the sub-pixel driver circuit;
the plurality of electrical connection structures are corresponding to the sub-pixel groups respectively, where each of the electrical connection structures is between two sub-pixels included in a corresponding one of the sub-pixel groups, and the electrical connection structure includes a first electrical connection layer, a second electrical connection layer and a third electrical connection layer disposed in different layers;
the first electrical connection layer includes a first electrical connection element and a second electrical connection element, and there is a first gap between the first electrical connection element and the second electrical connection element; the first electrical connection element is coupled to the first signal line pattern included in each sub-pixel in the corresponding sub-pixel group, and the second electrical connection element is coupled to the second signal line pattern included in each sub-pixel in the corresponding sub-pixel group;
the second electrical connection layer includes a third electrical connection element and at least one fourth electrical connection element, and there is a second gap between the third electrical connection element and the fourth electrical connection element that are adjacent; the third electrical connection element is coupled to the third signal line pattern included in each sub-pixel in the corresponding sub-pixel group, the at least one fourth electrical connection element respectively corresponds to the fourth signal line patterns included in both the sub-pixels in the corresponding sub-pixel group and each of the at least one fourth electrical connection element is coupled to a corresponding one of the fourth signal line patterns;

the third electrical connection layer is coupled to the fifth signal line pattern included in each sub-pixel in the corresponding sub-pixel group, the fifth signal line pattern is used to transmit a fifth signal with a fixed electrical potential, and an orthographic projection of the third electrical connection layer onto a substrate of the display panel covers at least part of an orthographic projection of the first gap onto the substrate and at least part of an orthographic projection of the second gap onto the substrate.

BRIEF DESCRIPTION OF THE DRAWINGS

The accompanying drawings described herein are used to provide further understanding of present disclosure and constitute a part of the present disclosure. The exemplary embodiments of the present disclosure and the description thereof serve to explain the present disclosure, and do not constitute an undue limitation onto the present disclosure.

DETAILED DESCRIPTION

To further describe the display panel and the display device according to embodiments of the present disclosure, a detailed description is given below with reference to the accompanying drawings of the specification.

Figure 1:
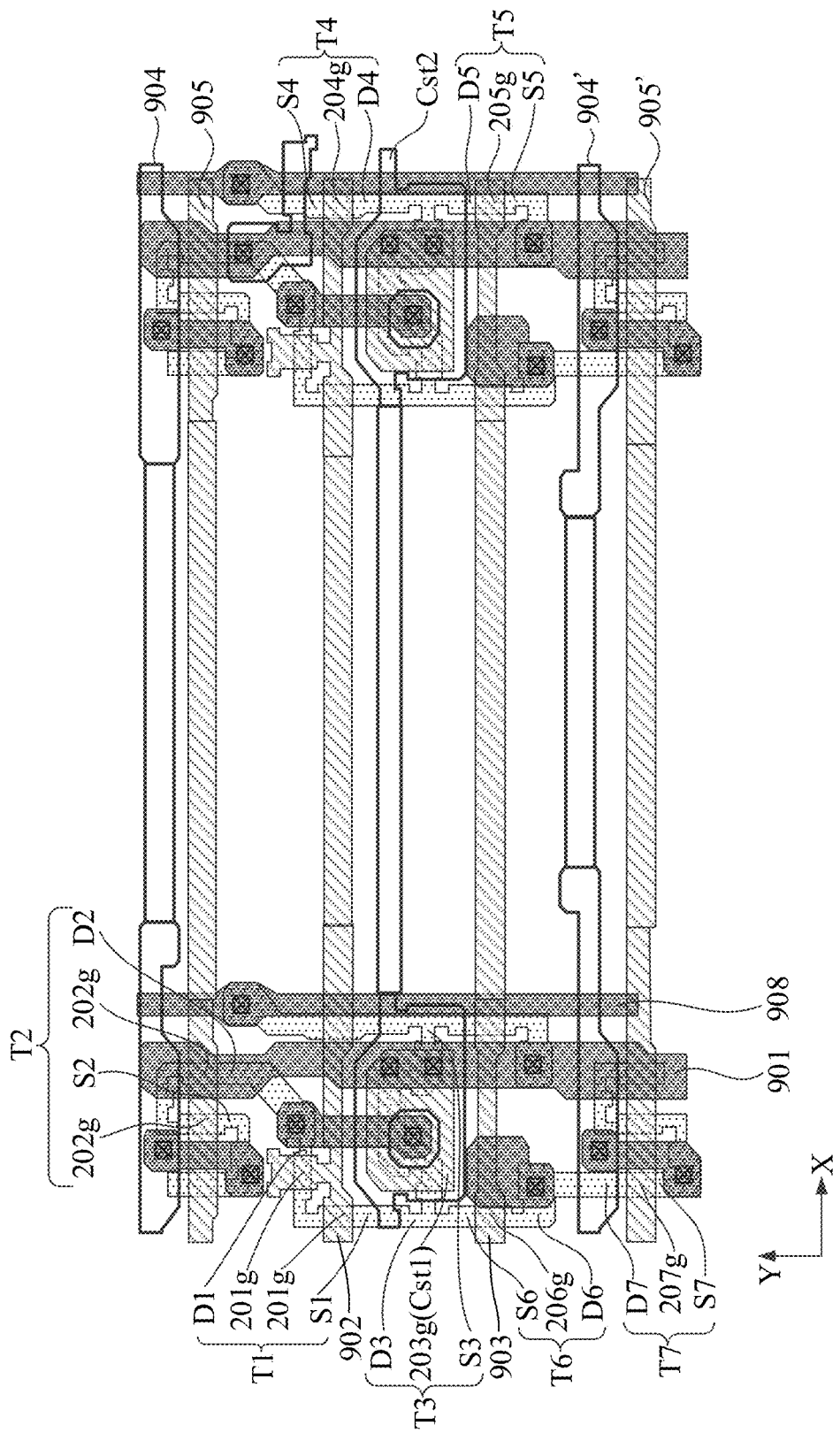
FIG. 1 is a first schematic diagram of a layout of sub-pixel groups according to an embodiment of the present disclosure.

As shown in FIG. 1, the present disclosure provides a display panel. The display panel includes a first pixel region and a second pixel region, where a pixel density of the second pixel region is lower than a pixel density of the first pixel region; the second pixel region includes a plurality of pixel units arranged in array, the plurality of pixel units form multiple rows of pixel units and each row of pixel units includes multiple pixel units arranged in a first direction; each of the pixel units includes multiple sub-pixels arranged in the first direction, and two sub-pixels that are closest to each other and belong respectively to two adjacent pixel units in a same row of pixel units form a sub-pixel group; the sub-pixel includes: a sub-pixel driver circuit, and signal line patterns coupled to the sub-pixel driver circuit. The signal line patterns may specifically include: a power signal line pattern 901, a data line pattern 908, a gate line pattern 902, a light emission control signal line pattern 903, a first reset signal line pattern 905, a first initialization signal line pattern 904, a second reset signal line pattern 905' and a second initialization signal line pattern 904'. It is noted, the pixel density represents a quantity of pixels per inch.

Similarly, a plurality of pixel units arranged in array are provided in the first pixel region, and sub-pixels included in each pixel unit have the same structure as those in the second pixel region. Since an under-screen camera is provided in the second pixel region, the second pixel region has a lower pixel density. In arranging the pixel units in the first pixel region and the second pixel region, the pixel units in the first pixel region have a tight layout, while the pixel units in the second pixel region have a loose layout. In the second pixel region, two adjacent pixel units in the same row of pixel units have a relatively larger spacing, thus it is necessary to provide an electrical connection structure for the sub-pixel group to couple together the same type of signal line patterns included in the sub-pixels in the sub-pixel group.

Continuing referring to FIG. 1, the electrical connection structure between two sub-pixels in the sub-pixel group includes seven electrical connection elements. The seven electrical portions are used to be coupled to first initialization signal line patterns 904 included in the sub-pixels in the sub-pixel group, be coupled to first reset signal line patterns 905 included in the sub-pixels in the sub-pixel group, be coupled to gate line patterns 902 included in the sub-pixels in the sub-pixel group, be coupled to light emission control signal line patterns 903 included in the sub-pixels in the sub-pixel group, be coupled to second initialization signal line patterns 904' included in the sub-pixels in the sub-pixel group, be coupled to second reset signal line patterns 905' included in the sub-pixels in the sub-pixel group, and be coupled to power signal line patterns 901 included in the sub-pixels in the sub-pixel group, respectively.

Although both the display function of the display panel and the camera function of the camera can be achieved by reducing the pixel density of the second pixel region where the camera is located in the display panel provided in the above embodiment, there is a gap between adjacent electrical connection elements and light passing through the gap causes diffraction and glare, thereby impacting the imaging quality of the camera when a picture is taken. In addition, due to the large quantity of formed electrical connection elements, a large area of layout space is occupied, which results in a low screen transmittance in the second pixel region, thereby impacting the imaging quality of the camera when a picture is taken.

Figure 4:
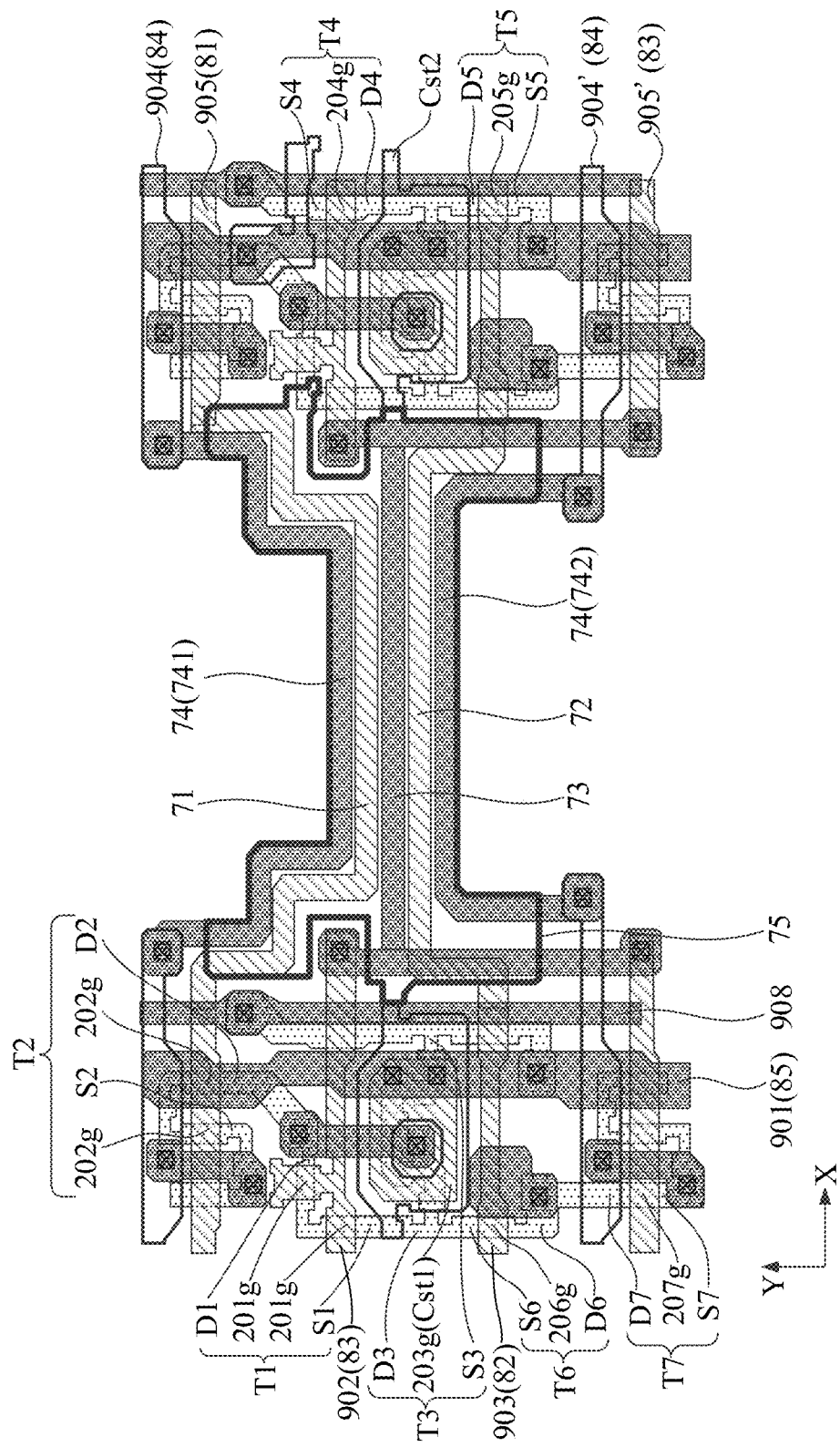
FIG. 4 is a second schematic diagram of a layout of sub-pixel groups according to an embodiment of the present disclosure.
Figure 10:
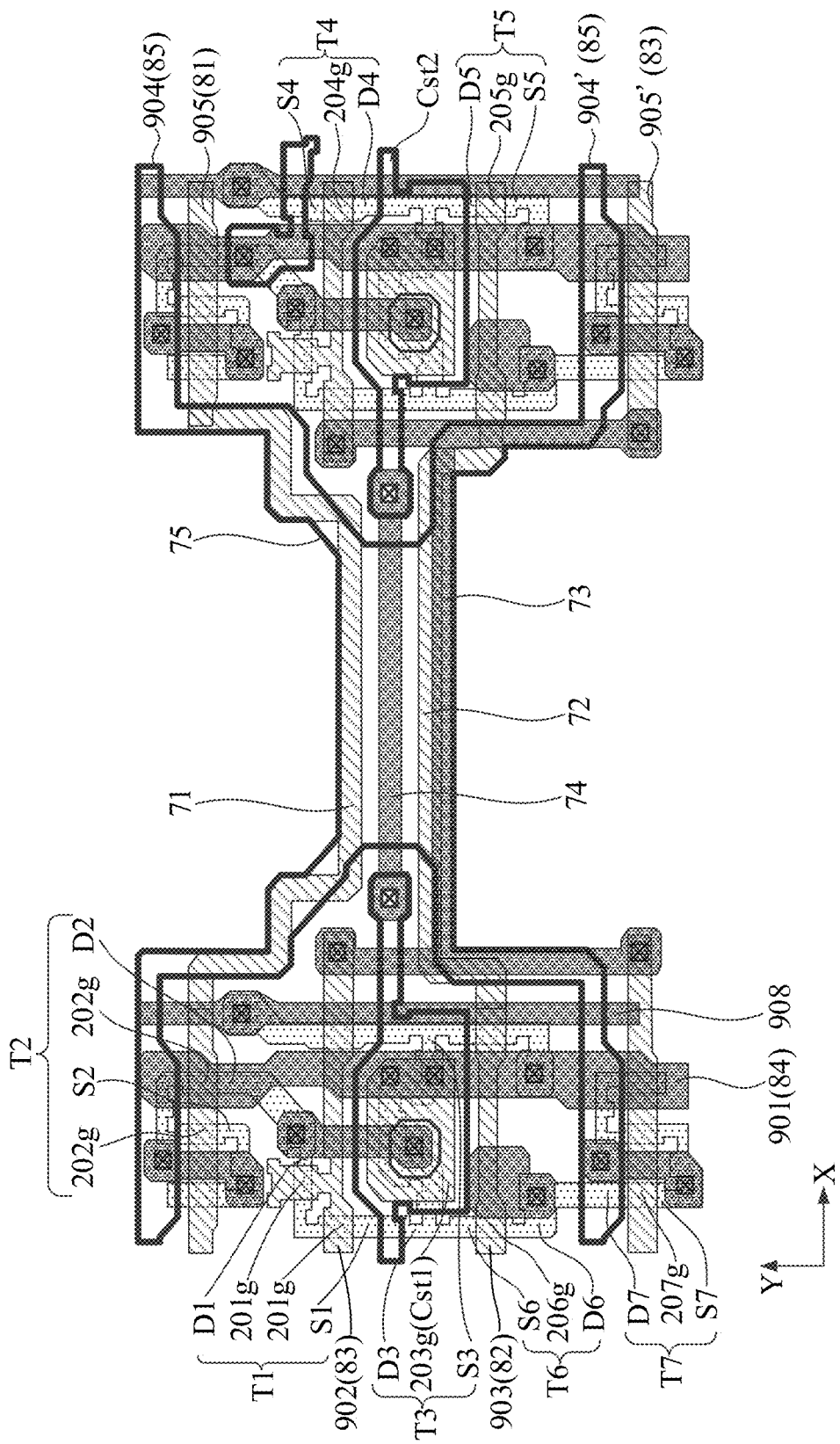
FIG. 10 is a third schematic diagram of a layout of sub-pixel groups according to an embodiment of the present disclosure.

Referring to FIG. 4 and FIG. 10, an embodiment of the present disclosure provides a display panel. The display panel includes a first pixel region and a second pixel region, where a pixel density of the second pixel region is lower than a pixel density of the first pixel region; the second pixel region includes a plurality of pixel units arranged in array, the plurality of pixel units form multiple rows of pixel units and each row of pixel units includes multiple pixel units arranged in a first direction; each of the pixel units includes multiple sub-pixels arranged in the first direction, and two sub-pixels that are closest to each other and belong respectively to two adjacent pixel units in a same row of pixel units form a sub-pixel group; the sub-pixel includes: a sub-pixel driver circuit, and a first signal line pattern 81 to a fifth signal line pattern 85 coupled to the sub-pixel driver circuit;

the display panel further includes a plurality of electrical connection structures corresponding to the sub-pixel groups respectively, where the electrical connection structure is between two sub-pixels included in the corresponding sub-pixel group, and the electrical connection structure includes a first electrical connection layer, a second electrical connection layer and a third electrical connection layer 75 disposed in different layers;

the first electrical connection layer includes a first electrical connection element 71 and a second electrical connection element 72, and there is a first gap between the first electrical connection element 71 and the second electrical connection element 72; the first electrical connection element 71 is coupled to the first signal line pattern 81 included in each sub-pixel in the corresponding sub-pixel group, and the second electrical connection element 72 is coupled to the second signal line pattern 82 included in each sub-pixel in the corresponding sub-pixel group;

the second electrical connection layer includes a third electrical connection element 73 and at least one fourth electrical connection element 74, and there is a second gap between the third electrical connection element 73 and the fourth electrical connection element 74 that are adjacent; the third electrical connection element 73 is coupled to the third signal line pattern 83 included in each sub-pixel in the corresponding sub-pixel group, the at least one fourth electrical connection element 74 respectively corresponds to the fourth signal line patterns 84 included in the two sub-pixels in the corresponding sub-pixel group and each of the at least one fourth electrical connection element 74 is coupled to a corresponding one of the fourth signal line patterns 84;

the third electrical connection layer 75 is coupled to the fifth signal line pattern 85 included in each sub-pixel in the corresponding sub-pixel group, the fifth signal line pattern 85 is used to transmit a fifth signal with a fixed electrical potential, and an orthographic projection of the third electrical connection layer 75 onto a substrate of the display panel covers at least part of an orthographic projection of the first gap onto the substrate and at least part of an orthographic projection of the second gap onto the substrate.

Specifically, the display panel includes the first pixel region and the second pixel region. Both the first and second pixel regions can achieve the display function. A pixel density of the second pixel region is lower than a pixel density of the first pixel region. In the second pixel region, a camera is provided between the substrate and the sub-pixel driver circuit.

There are a variety of specific layout manners of pixel units in the first pixel region and the second pixel region. For example, both the pixel units in the first pixel region and the pixel units in the second pixel region are arranged in array. For example, along the first direction, in the same row of pixel units in the display panel, a signal line pattern in the first pixel region is electrically connected to a signal line pattern used for transmitting the same signal in the second pixel region.

In the second pixel region, the plurality of pixel units arranged in array may form multiple rows of pixel units arranged sequentially in the second direction, and each row of pixel units includes multiple pixel units arranged sequentially in the first direction. The first direction and the second direction intersect. For example, the first direction includes an X direction, and the second direction includes a Y direction.

In the second pixel region, each pixel unit includes multiple sub-pixels arranged in the first direction. For example, each pixel unit includes a red sub-pixel, a green sub-pixel and a blue sub-pixel arranged in the first direction. The sub-pixels included in each pixel unit are arranged tightly, and the signal line patterns used for transmitting the same signal included in the sub-pixels of a single pixel unit are directly coupled. For example, the signal line patterns used for transmitting the same signal included in the sub-pixels of a single pixel unit may form an integral structure.

Two sub-pixels that are closest to each other and belong respectively to two adjacent pixel units in a same row of pixel units form a sub-pixel group. For example, each pixel unit includes a first sub-pixel, a second sub-pixel and a third sub-pixel arranged sequentially in the first direction, and the sub-pixel group includes the third sub-pixel of the first pixel unit among two adjacent pixel units and the first sub-pixel of the second pixel unit among the two adjacent pixel units that is subsequent to the first pixel unit.

For example, the sub-pixels included in the pixel units in the first and second pixel regions have the same specific structure. Each sub-pixel includes a sub-pixel driver circuit, and multiple signal line patterns coupled to the sub-pixel driver circuit. For example, the multiple signal line patterns include a first signal line pattern 81, a second signal line pattern 82, a third signal line pattern 83, a fourth signal line pattern 84 and a fifth signal line pattern 85. Each signal line pattern is used to transmit a corresponding signal.

In the first pixel region, the pixel units in the same row in the first direction are arranged tightly. In the second pixel region, adjacent pixel units in the same row in the first direction have a certain spacing, and the spacing is between two sub-pixels of the sub-pixel group, to allow light to pass through, so that the camera in the second pixel region may achieve the camera function.

It is noted, under the condition that a pixel density requisite for the screen display is provided, the pixel density or pixel size of the second pixel region should be reduced as much as possible (existing manufacturing process requirement needs to be met) and an area of the electrical connection element between sub-pixels should be reduced as much as possible, so as to further improve the light transmittance of the second pixel region.

The display panel further includes: a plurality of electrical connection structures corresponding to the sub-pixel groups respectively, where each electrical connection structure is between two sub-pixels included in the corresponding sub-pixel group. The electrical connection structures may have a variety of specific structures, for example, the electrical connection structure includes a first electrical connection layer, a second electrical connection layer and a third electrical connection layer 75. Any two layers among the first electrical connection layer, the second electrical connection layer and the third electrical connection layer 75 are disposed in different layers.

There are a variety of specific structures and connection relationships of the first electrical connection layer, the second electrical connection layer and the third electrical connection layer 75, which are described exemplarily below.

The first electrical connection layer includes a first electrical connection element 71 and a second electrical connection element 72. At least part of the first electrical connection element 71 extends in the first direction, at least part of the second electrical connection element 72 extends in the first direction, and there is a first gap between the first electrical connection element 71 and the second electrical connection element 72. The first electrical connection element 71 is coupled to the first signal line pattern 81 included in each sub-pixel in the corresponding sub-pixel group. For example, the first electrical connection element 71 and the first signal line pattern 81 to which the first electrical connection element 71 is coupled form an integral structure. The second electrical connection element 72 is coupled to the second signal line pattern 82 included in each sub-pixel in the corresponding sub-pixel group. For example, the second electrical connection element 72 and the second signal line pattern 82 to which the second electrical connection element 72 is coupled form an integral structure.

The second electrical connection layer includes a third electrical connection element 73 and at least one fourth electrical connection element 74. At least part of the third electrical connection element 73 extends in the first direction, at least part of the fourth electrical connection element 74 extends in the first direction, and there is a second gap between the third electrical connection element 73 and the fourth electrical connection element 74 that are adjacent. The third electrical connection element 73 is coupled to the third signal line pattern 83 included in each sub-pixel in the corresponding sub-pixel group. For example, an orthographic projection of the third electrical connection element 73 onto the substrate and an orthographic projection of the third signal line pattern 83, to which the third electrical connection element 73 is coupled, onto the substrate form an overlapped area, and in the overlapped area, the third electrical connection element 73 is coupled to the third signal line pattern 83 through a via hole. It is noted, the first gap and the second gap are usually small gaps, and the first gap and the second gap may be configured as the minimum gap satisfying an insulation condition between two electrical connection elements.

The at least one fourth electrical connection element 74 respectively corresponds to the fourth signal line patterns 84 included in both the sub-pixels in the corresponding sub-pixel group and each of the at least one fourth electrical connection element 74 is coupled to a corresponding one of the fourth signal line pattern 84. For example, as shown in FIG. 4, an orthographic projection of the fourth electrical connection element 74 onto the substrate and an orthographic projection of the fourth signal line pattern 84, to which the fourth electrical connection element 74 is coupled, onto the substrate form an overlapped area, and in the overlapped area, the fourth electrical connection element 74 is coupled to the fourth signal line pattern 84 through a via hole.

The third electrical connection layer 75 is coupled to the fifth signal line pattern 85 included in each sub-pixel in the corresponding sub-pixel group, the fifth signal line pattern 85 is used to transmit a fifth signal with a fixed electrical potential. For example, the third electrical connection layer 75 and the fifth signal line pattern 85 to which the third electrical connection layer 75 is coupled form an integral structure. For example, the fifth signal line pattern 85 is coupled to a target pattern in the display pattern. An orthographic projection of the third electrical connection layer 75 onto the substrate and an orthographic projection of the target pattern onto the substrate form an overlapped area, and in the overlapped area, the third electrical connection layer 75 is coupled to the target pattern through a via hole, so as to enable the third electrical connection layer 75 to be coupled to the fifth signal line pattern 85 through the target pattern.

At least part of the third electrical connection layer 75 extends in the first direction, for example, an orthographic projection of the third electrical connection layer 75 onto a substrate of the display panel covers an orthographic projection of at least part of the first gap onto the substrate and an orthographic projection of at least part of the second gap onto the substrate. For example, the orthographic projection of the third electrical connection layer 75 onto a substrate of the display panel entirely covers at least part of an orthographic projection of the first gap onto the substrate and at least part of an orthographic projection of the second gap onto the substrate.

As can be known from the specific structure of the foregoing display panel, in the display panel according to the embodiments of the present disclosure, an electrical connection structure is provided between two sub-pixels included in the sub-pixel group. The electrical connection structure includes: a first electrical connection layer, a second electrical connection layer and a third electrical connection layer 75 disposed in different layers. The first electrical connection layer and the second electrical connection layer are used to couple together the signal line patterns which are used for transmitting the same signal and are included in the sub-pixels in the sub-pixel group, and the third electrical connection layer 75 is used to couple together the fifth signal line patterns 85 which are used for transmitting the fifth signal with the fixed electrical potential and are included in the sub-pixels in the sub-pixel group. Therefore, by configuring the electrical connection structure in the display panel according to the embodiment of the present disclosure, it can be achieved that the signal line patterns which are used for transmitting the same signal and are included in the sub-pixels in the sub-pixel group are correspondingly coupled together.

Further, in the display panel according to the embodiment of the present disclosure, by means of the setting that the orthographic projection of the third electrical connection layer 75 onto a substrate of the display panel covers at least part of an orthographic projection of the first gap onto the substrate and at least part of an orthographic projection of the second gap onto the substrate, the third electrical connection layer 75 may cover the gap between adjacent electrical connection elements between two sub-pixels in the sub-pixel group, thereby reducing the light leakage at the gap, preventing the interfering diffraction, glare and the like arising when the light passes through the gap, and better ensuring the imaging quality of the camera in the display panel when a picture is taken.

In addition, in the display panel according to the embodiments of the present disclosure, the third electrical connection layer 75 is coupled to the fifth signal line pattern 85 used for transmitting the fifth signal with the fixed electrical potential, such that the third electrical connection layer 75 has a steady electrical potential and has no significant effect on the RC loading of the fifth signal line pattern 85.

Figure 6:
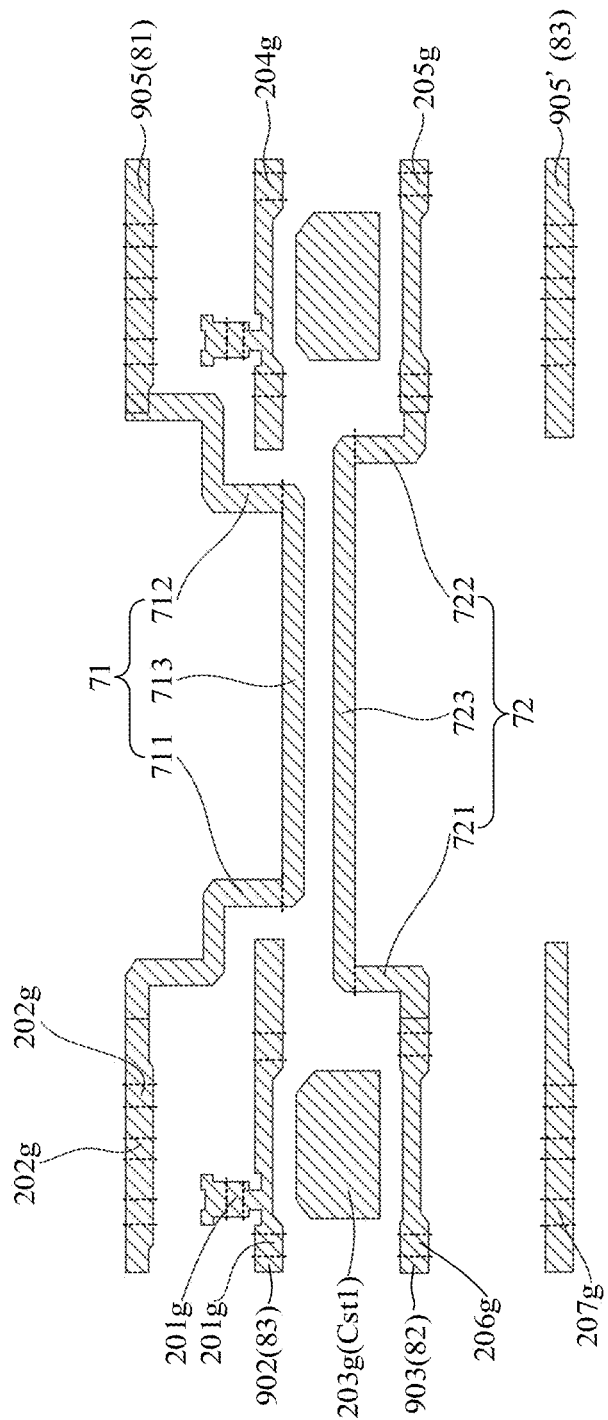
FIG. 6 is a schematic diagram of a layout of a first gate metal layer in the FIG. 4.

As shown in FIG. 4 and FIG. 6, in some embodiments, the first signal line pattern 81 includes a first reset signal line pattern 905, and at least part of the first reset signal line pattern 905 extends in the first direction; the second signal line pattern 82 includes a light emission control signal line pattern 903, and at least part of the light emission control signal line pattern 903 extends in the first direction.

In specific, the first electrical connection element 71 is coupled to the first reset signal line patterns 905 included in the sub-pixels in the corresponding sub-pixel group. For example, the first electrical connection element 71 and the first reset signal line patterns 905 to which the first electrical connection element 71 is coupled form an integral structure.

The second electrical connection element 72 is coupled to the light emission control signal line patterns 903 included in the sub-pixels in the corresponding sub-pixel group. For example, the second electrical connection element 72 and the light emission control signal line patterns 903 to which the second electrical connection element 72 is coupled form an integral structure.

For example, in the same sub-pixel, the first reset signal line pattern 905 and the light emission control signal line pattern 903 are arranged in the second direction. The second direction and the first direction intersect.

In the display panel according to the foregoing embodiment, by means of the setting that the first signal line pattern 81 includes a first reset signal line pattern 905 and the first electrical connection element 71 and the first reset signal line patterns 905 to which the first electrical connection element 71 is coupled form an integral structure, the first electrical connection element 71 and the first reset signal line patterns 905 may be formed simultaneously in a single patterning process, and the formed first electrical connection element 71 and first reset signal line patterns 905 may be coupled directly. In a same way, by means of the setting that the second signal line pattern 82 includes a light emission control signal line pattern 903 and the second electrical connection element 72 and the light emission control signal line patterns 903 to which the second electrical connection element 72 is coupled form an integral structure, the second electrical connection element 72 and the light emission control signal line patterns 903 may be formed simultaneously in a single patterning process, and the formed second electrical connection element 72 and light emission control signal line patterns 903 may be coupled directly. Thus, the display panel provided in the foregoing embodiment effectively simplifies the manufacturing process flow and reduces manufacturing costs.

As shown in FIG. 4, FIG. 8, FIG. 10 and FIG. 12, in some embodiments, the third signal line pattern 83 includes a gate line pattern 902 and a second reset signal line pattern 905' arranged in a second direction, at least part of the gate line pattern 902 and at least part of the second reset signal line pattern 905' all extend in the first direction, and the gate line pattern 902 and the second reset signal line pattern 905' are used to transmit a same third signal;

the third electrical connection element 73 includes a first portion 731, a second portion 732 and a third portion 733, the first portion 731 and the second portion 732 extend in the second direction, the third portion 733 extends in the first direction, and the second direction and the first direction intersect; the first portion 731 is coupled to the gate line pattern 902 and the second reset signal line pattern 905' included in one sub-pixel in the sub-pixel group, the second portion 732 is coupled to the gate line pattern 902 and the second reset signal line pattern 905' included in the other sub-pixel in the sub-pixel group, and the third portion 733 is coupled to the first portion 731 and the second portion 732.

In specific, in each sub-pixel, the third signal line pattern 83 includes the gate line pattern 902 and the second reset signal line pattern 905' arranged in the second direction, and the gate line pattern 902 and the second reset signal line pattern 905' are used to transmit a same third signal.

The third electrical connection element 73 may have a variety of specific structures, for example, the third electrical connection element 73 includes the first portion 731, the second portion 732 and the third portion 733. The first portion 731 and the second portion 732 extend in the second direction, and the third portion 733 extends in the first direction. For example, the first portion 731, the second portion 732 and the third portion 733 form an integral structure.

The first portion 731 is used to be coupled to the gate line pattern 902 and the second reset signal line pattern 905' included in the first sub-pixel in the sub-pixel group. For example, an orthographic projection of the first portion 731 onto the substrate form overlapped areas with an orthographic projection of the gate line pattern 902 onto the substrate and an orthographic projection of the second reset signal line pattern 905' onto the substrate respectively. The first portion 731 may be coupled to the gate line pattern 902 and the second reset signal line pattern 905' respectively through via holes formed in the overlapped areas.

The second portion 732 is used to be coupled to the gate line pattern 902 and the second reset signal line pattern 905' included in the second sub-pixel in the sub-pixel group. For example, an orthographic projection of the second portion 732 onto the substrate form overlapped areas with an orthographic projection of the gate line pattern 902 onto the substrate and an orthographic projection of the second reset signal line pattern 905' onto the substrate respectively. The second portion 732 may be coupled to the gate line pattern 902 and the second reset signal line pattern 905' respectively through via holes formed in the overlapped areas.

In the display panel according to the foregoing embodiment, by means of the setting that the gate line patterns 902 and the second reset signal line patterns 905' which are used to transmit the same third signal and are included in the sub-pixels in the corresponding sub-pixel group are coupled together by the third electrical connection element 73, the layout space occupied by the electrical connection structure is effectively reduced, thereby further improving the light transmittance of the second pixel region.

Further, in the display panel according to the foregoing embodiment, by means of the setting that the first portion 731, the second portion 732 and the third portion 733 form an integral structure, the third electrical connection element 73 may be formed in one and the same patterning process, thereby effectively simplifying the manufacturing process flow of the display panel and reducing manufacturing costs.

Figure 7:
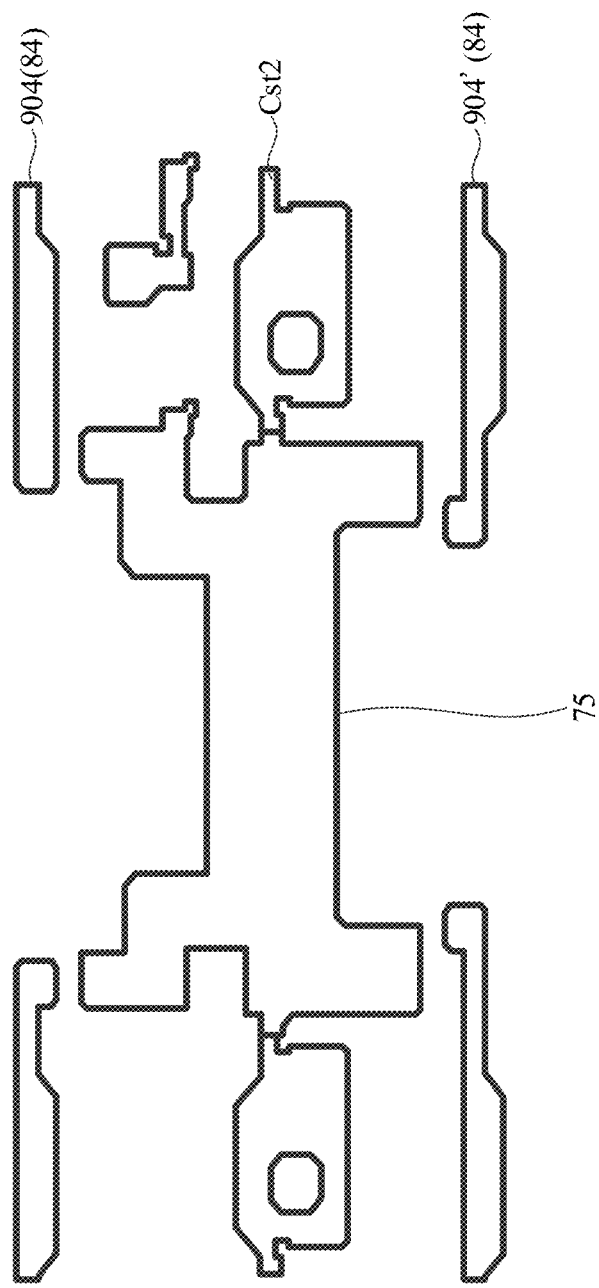
FIG. 7 is a schematic diagram of a layout of a second gate metal layer in the FIG. 4.
Figure 9:
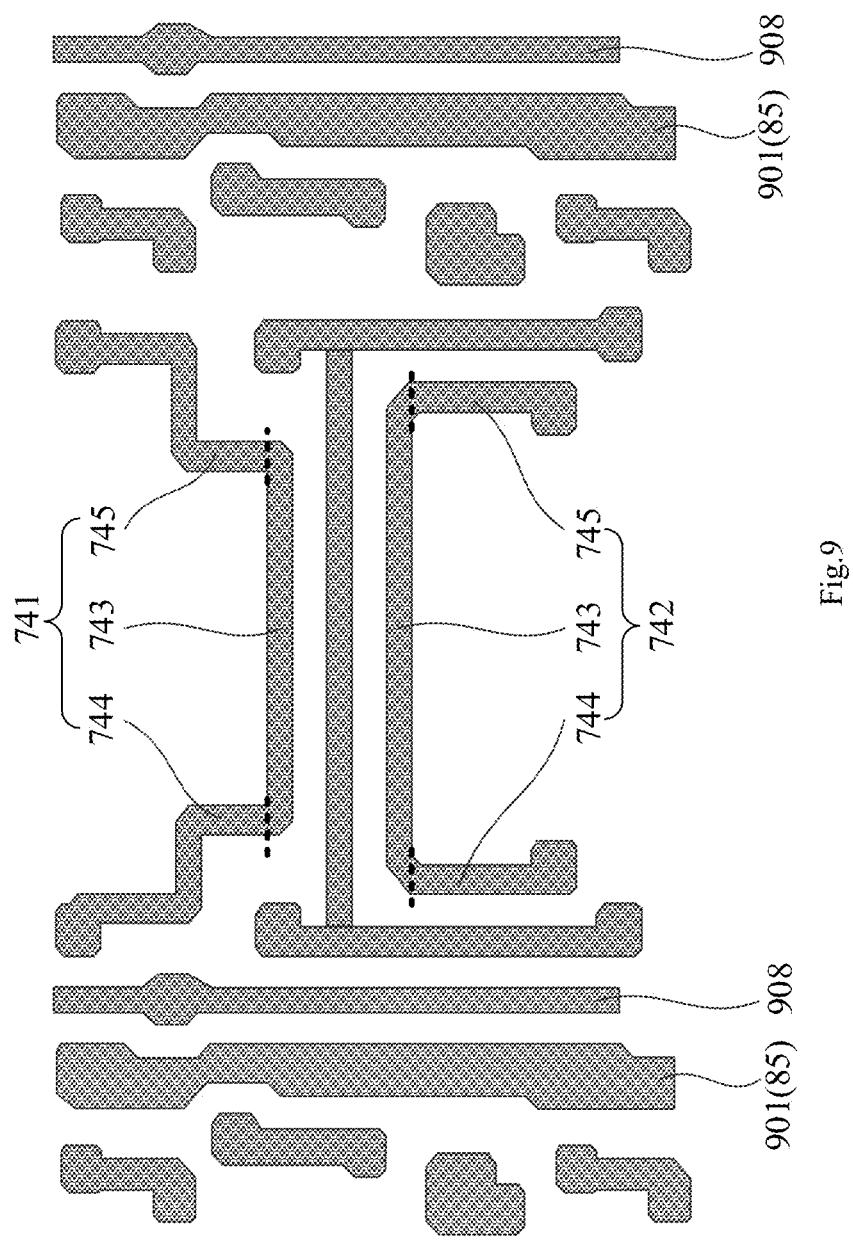
FIG. 9 is a second schematic diagram of a first source-drain metal layer in the FIG. 4.

As shown in FIG. 4, FIG. 7 and FIG. 9, in some embodiments, the fourth signal line pattern 84 includes two initialization signal line patterns arranged in a second direction, the second direction and the first direction intersect, the second electrical connection layer includes two fourth electrical connection elements 74, the two fourth electrical connection elements 74 are in a one-to-one correspondence with the initialization signal line patterns included in each sub-pixel in the corresponding sub-pixel group, and each of the fourth electrical connection elements 74 is coupled to the corresponding fourth signal line pattern 84;

at least part of an orthographic projection of the third electrical connection element 73 onto the substrate is between orthographic projections of the two fourth electrical connection elements 74 onto the substrate.

Specifically, the fourth signal line pattern 84 includes a first initialization signal line pattern 904 and a second initialization signal line pattern 904' arranged in the second direction, and at least part of the first initialization signal line pattern 904 and at least part of the second initialization signal line pattern 904' extend in the first direction.

The second electrical connection layer includes two fourth electrical connection elements 74. One of the fourth electrical connection elements 74 is coupled to the first initialization signal line patterns 904 included in the sub-pixels in the corresponding sub-pixel group, and the other one of the fourth electrical connection elements 74 is coupled to the second initialization signal line patterns 904' included in the sub-pixels in the corresponding sub-pixel group.

When it is set that the second electrical connection layer includes two fourth electrical connection elements 74, the third electrical connection element 73 may be arranged with respect to the two fourth electrical connection elements 74 in a variety of manner. For example, it may be set that an orthographic projection of at least part of the third electrical connection element 73 onto the substrate is between orthographic projections of the two fourth electrical connection elements 74 onto the substrate. For example, an orthographic projection of the third portion 733 of the third electrical connection element 73 onto the substrate is between orthographic projections of the two fourth electrical connection elements 74 onto the substrate.

Since, in the display panel, the first initialization signal line pattern 904, the gate line pattern 902, the second initialization signal line pattern 904' and the second reset signal line pattern 905' included in each sub-pixel are arranged sequentially in the second direction, and an orthographic projection of the third electrical connection element 73 onto the substrate is between orthographic projections of the two fourth electrical connection elements 74 onto the substrate, difficulties in arranging the third electrical connection element 73 and the two fourth electrical connection elements 74 are reduced while ensuring the insulation between the third electrical connection element 73 and the fourth electrical connection elements.

Figure 8:
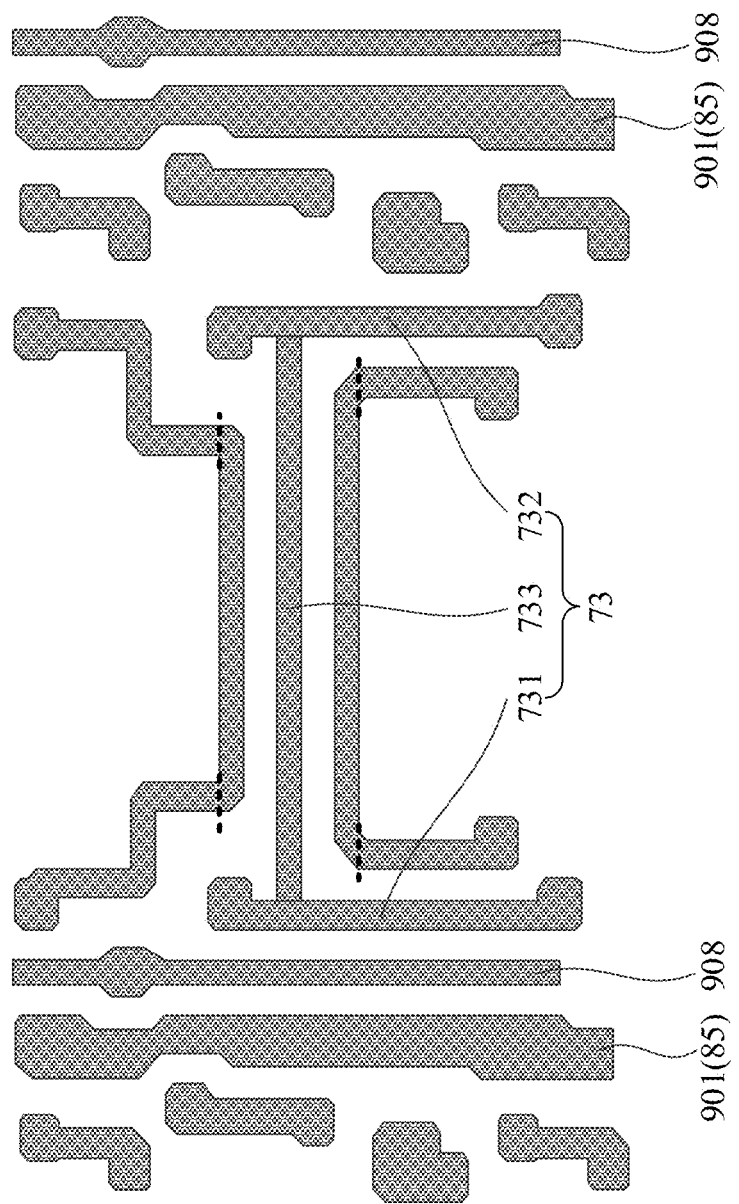
FIG. 8 is a first schematic diagram of a first source-drain metal layer in the FIG. 4.

As shown in FIG. 4, FIG. 7 and FIG. 8, in some embodiments, the sub-pixel driver circuit includes a storage capacitor, the storage capacitor includes a first electrode plate and a second electrode plate arranged oppositely, and the first electrode plate is between the substrate and the second electrode plate; the fifth signal line pattern 85 includes a power signal line pattern 901, at least part of the power signal line pattern 901 extends in the second direction, the second electrode plate and the power signal line pattern 901 in the same sub-pixel are coupled to each other; the third electrical connection layer 75 is coupled to the second electrode plate included in each sub-pixel in the corresponding sub-pixel group.

In specific, the sub-pixel driver circuit includes a driver transistor and a storage capacitor. The storage capacitor includes a first electrode plate and a second electrode plate arranged oppositely, and the first electrode plate is between the substrate and the second electrode plate. For example, the first electrode plate is reused as the gate electrode of the driver transistor. For example, the first electrode plate is made of the first gate metal layer in the display panel, and the second electrode plate is made of the second gate metal layer in the display panel.

The fifth signal line pattern 85 includes a power signal line pattern 901, and at least part of the power signal line pattern 901 extends in the second direction. In the same sub-pixel, an orthographic projection of the second electrode plate onto the substrate and an orthographic projection of the power signal line pattern 901 onto the substrate form an overlapped area, and in the overlapped area, the power signal line pattern 901 is coupled to the second electrode plate through a via hole. For example, the power signal line pattern 901 may be made of the first source-drain metal layer in the display panel. For example, the power signal line patterns 901 located in the same column of sub-pixels in the second direction are coupled to each other sequentially, and may be formed as an integral structure.

For example, the third electrical connection layer 75 may be made of the second gate metal layer in the display panel, that is, the third electrical connection layer 75 and the second electrode plate are arranged in a same layer and are made of a same material. In this way, the third electrical connection layer 75 and the second electrode plate may be formed in one and the same patterning process, and can be coupled directly, thereby effectively simplifying the manufacturing process flow of the display panel and reducing manufacturing costs.

In the display panel according to the foregoing embodiment, by means of the setting that the power signal line pattern 901 is coupled to the second electrode plate and the third electrical connection layer 75 is coupled to the second electrode plates included in the sub-pixels in the corresponding sub-pixel group, the third electrical connection layer 75 may be coupled to the power signal line patterns 901 included in the sub-pixels in the corresponding sub-pixel group, such that the third electrical connection layer 75 has the same steady electrical potential as the power signal line pattern 901. Thus, when a third electrical connection layer 75 with a large area is used to cover the gap between adjacent electrical connection elements, the operation stability of the display panel may be better ensured.

In some embodiments, an orthographic projection of the first electrical connection element 71 onto the substrate overlaps with an orthographic projection of the third electrical connection element 73 onto the substrate and an orthographic projection of one of the two fourth electrical connection elements 74 onto the substrate; and/or, an orthographic projection of the second electrical connection element 72 onto the substrate overlaps with an orthographic projection of the third electrical connection element 73 onto the substrate and an orthographic projection of the other one of the two fourth electrical connection elements 74 onto the substrate.

Specifically, since both the first electrical connection element 71 and the second electrical connection element 72 are arranged in a layer different from the third electrical connection element 73 and the fourth electrical connection element 74, no short circuit would occur between the first electrical connection element 71 and the third electrical connection element 73 and between the first electrical connection element 71 and the fourth electrical connection element 74, even though the first electrical connection element 71 overlaps with the third electrical connection element 73 and the fourth electrical connection element 74 in a direction perpendicular to the substrate. In the same way, no short circuit would occur between the second electrical connection element 72 and the third electrical connection element 73 and between the second electrical connection element 72 and the fourth electrical connection element 74, even though the second electrical connection element 72 overlaps with the third electrical connection element 73 and the fourth electrical connection element 74 in a direction perpendicular to the substrate.

The foregoing setting that an orthographic projection of the first electrical connection element 71 onto the substrate overlaps with an orthographic projection of the third electrical connection element 73 onto the substrate and an orthographic projection of one of the two fourth electrical connection elements 74 onto the substrate can effectively reduce the layout space occupied by the first electrical connection element 71, the third electrical connection element 73 and the fourth electrical connection element 74 as a whole. In the same way, the setting that an orthographic projection of the second electrical connection element 72 onto the substrate overlaps with an orthographic projection of the third electrical connection element 73 onto the substrate and an orthographic projection of the other one of the two fourth electrical connection elements 74 onto the substrate can effectively reduce the layout space occupied by the second electrical connection element 72, the third electrical connection element 73 and the fourth electrical connection element 74 as a whole. Therefore, the foregoing setting manner may reduce the layout space occupied by the electrical connection structure to the maximum extent, and effectively improve the light transmittance of the display panel in the second pixel region.

As shown in FIG. 4, in some embodiments, the first electrical connection element 71, the second electrical connection element 72, and the fourth electrical connection elements 74 all include a first side portion, a second side portion and a middle portion between the first side portion and the second side portion; the middle portion extends in the first direction, the first side portion includes a portion extending in the first direction and a portion extending in the second direction, and the second side portion includes a portion extending in the first direction and a portion extending in the second direction;

as shown in FIG. 6 and FIG. 9, an orthographic projection of the middle portion 743 included in one of the two fourth electrical connection elements 74 onto the substrate, an orthographic projection of the middle portion included in the first electrical connection element 71 onto the substrate, an orthographic projection of a third portion 733 of the third electrical connection element 73 onto the substrate, an orthographic projection of the middle portion included in the second electrical connection element 72 onto the substrate, and an orthographic projection of the middle portion included in the other one of the two fourth electrical connection elements 74 onto the substrate are sequentially arranged in the second direction.

Specifically, the first electrical connection element 71, the second electrical connection element 72, and the fourth electrical connection elements 74 may have a variety of specific structures. For example, the first electrical connection element 71, each of the second electrical connection element 72, and the fourth electrical connection elements 74 include a first side portion, a second side portion and a middle portion between the first side portion and the second side portion.

For example, it may be set that the middle portion 713 of the first electrical connection element 71, the middle portion 723 of the second electrical connection element 72, and the middle portions 743 of the fourth electrical connection elements 74 all extend in the first direction; both the first side portion 711 and the second side portion 712 of the first electrical connection element 71 include a portion extending in the first direction and a portion extending in the second direction; both the first side portion 721 and the second side portion 722 of the second electrical connection element 72 include a portion extending in the first direction and a portion extending in the second direction; both the first side portion 744 and the second side portion 745 of one (e.g., labeled as 741 in the FIG. 9) of the two fourth electrical connection elements 74 include a portion extending in the first direction and a portion extending in the second direction; both the first side portion 744 and the second side portion 745 of the other one (e.g., labeled as 742 in the FIG. 9) of the two fourth electrical connection elements 74 include a portion extending in the second direction.

For example, an orthographic projection of the middle portion 743 included in one of the two fourth electrical connection elements 74 onto the substrate, an orthographic projection of the middle portion included in the first electrical connection element 71 onto the substrate, an orthographic projection of a third portion 733 of the third electrical connection element 73 onto the substrate, an orthographic projection of the middle portion included in the second electrical connection element 72 onto the substrate, and an orthographic projection of the middle portion included in the other one of the two fourth electrical connection elements 74 onto the substrate are immediately adjacent to each other, so as to reduce the layout space occupied by the electrical connection structure.

For example, in the first electrical connection element 71, the second electrical connection element 72, and the fourth electrical connection elements 74, both the first side portion and the second side portion extend in a direction away from the middle portion.

The foregoing setting that an orthographic projection of the middle portion included in one of the two fourth electrical connection elements 74 onto the substrate, an orthographic projection of the middle portion included in the first electrical connection element 71 onto the substrate, an orthographic projection of a third portion 733 of the third electrical connection element 73 onto the substrate, an orthographic projection of the middle portion included in the second electrical connection element 72 onto the substrate, and an orthographic projection of the middle portion included in the other one of the two fourth electrical connection elements 74 onto the substrate are immediately adjacent to each other and arranged sequentially in the second direction can effectively reduce the layout space occupied by the electrical connection structure while meeting the connection requirement.

Figure 11:
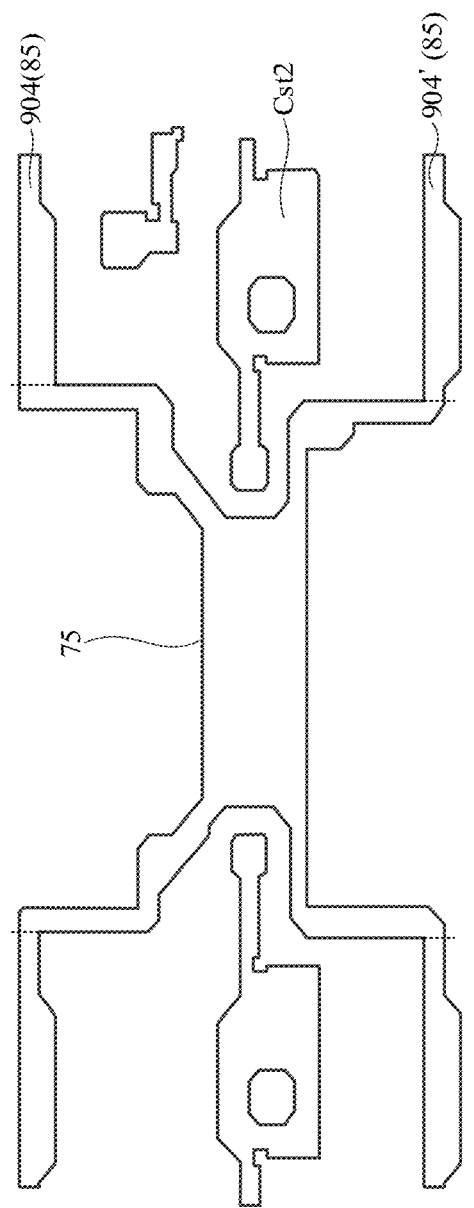
FIG. 11 is a schematic diagram of a layout of a second gate metal layer in the FIG. 10.
Figure 12:
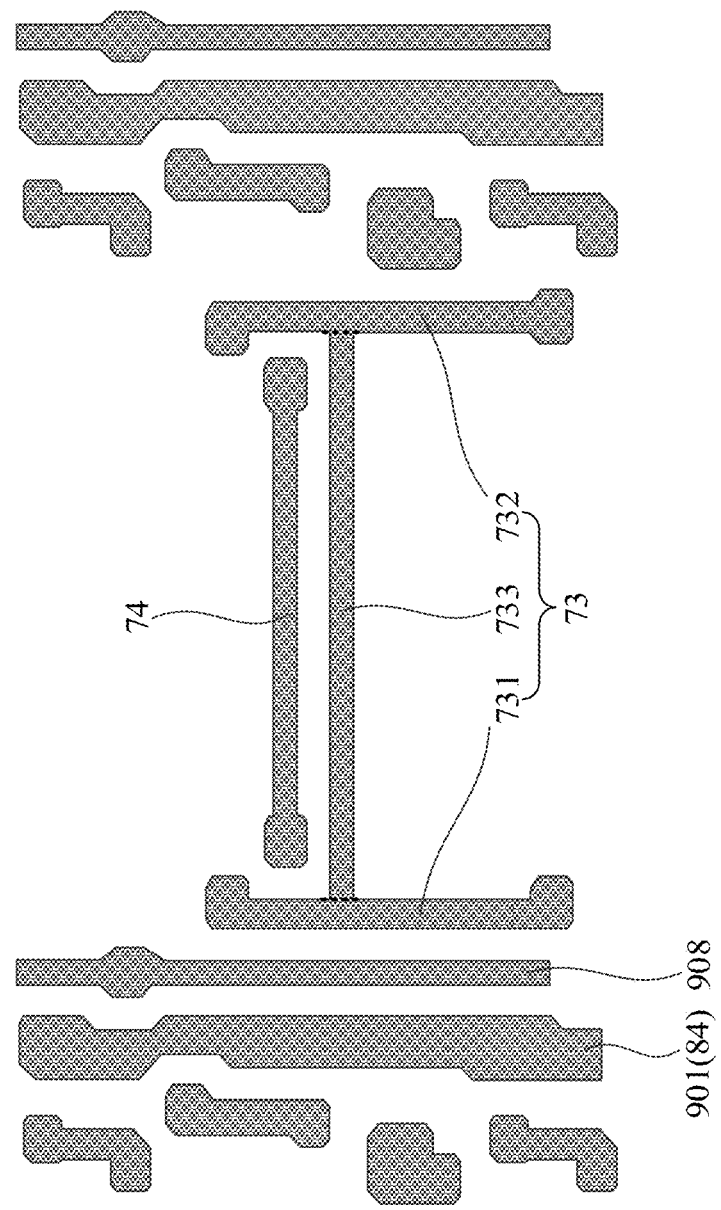
FIG. 12 is a schematic diagram of a layout of a first source-drain metal layer in the FIG. 10.

As shown in FIG. 10, FIG. 11 and FIG. 12, in some embodiments, the sub-pixel driver circuit includes a storage capacitor, the storage capacitor includes a first electrode plate and a second electrode plate arranged oppositely in a direction perpendicular to the substrate, and the first electrode plate is between the substrate and the second electrode plate;

the fourth signal line pattern 84 includes a power signal line pattern 901, at least part of the power signal line pattern 901 extends in a second direction, and the second electrode plate and the power signal line pattern 901 are coupled to each other;

the second electrical connection layer includes one fourth electrical connection element 74, and the fourth electrical connection element 74 is coupled to the second electrode plate included in each sub-pixel in the corresponding sub-pixel group.

In specific, the sub-pixel driver circuit includes a driver transistor and a storage capacitor. The storage capacitor includes a first electrode plate and a second electrode plate arranged oppositely, and the first electrode plate is between the substrate and the second electrode plate. For example, the first electrode plate is reused as the gate electrode of the driver transistor. For example, the first electrode plate is made of the first gate metal layer in the display panel, and the second electrode plate is made of the second gate metal layer in the display panel.

The fourth signal line pattern 84 includes a power signal line pattern 901, and at least part of the power signal line pattern 901 extends in the second direction. In the same sub-pixel, an orthographic projection of the second electrode plate onto the substrate and an orthographic projection of the power signal line pattern 901 onto the substrate form an overlapped area, and in the overlapped area, the power signal line pattern 901 is coupled to the second electrode plate through a via hole. For example, the power signal line pattern 901 may be made of the first source-drain metal layer in the display panel. For example, the power signal line patterns 901 located in the same column of sub-pixels in the second direction are coupled to each other sequentially, and may be formed as an integral structure.

The second electrical connection layer may include one fourth electrical connection element 74. For example, the fourth electrical connection element 74 is made of the first source-drain metal layer in the display panel. An orthographic projection of the fourth electrical connection element 74 onto the substrate and an orthographic projection of the corresponding second electrode plate onto the substrate have an overlapped area, and the fourth electrical connection element 74 is coupled to the corresponding second electrode plate through a via hole provided in the overlapped area.

In the display panel according to the foregoing embodiment, by means of the setting that the second electrode plate and the power signal line pattern 901 are coupled to each other and the fourth electrical connection element 74 is coupled to the second electrode plate included in each sub-pixel in the corresponding sub-pixel group, it can be achieved that the fourth electrical connection element 74 is coupled to the power signal line pattern 901 included in each sub-pixel in the corresponding sub-pixel group.

As shown in FIG. 10 and FIG. 11, in some embodiments, the fifth signal line pattern 85 includes two initialization signal line patterns arranged in the second direction, and the third electrical connection layer 75 is coupled to the initialization signal line patterns included in each sub-pixel in the corresponding sub-pixel group.

In specific, at least part of the initialization signal line pattern extends in the first direction, and the initialization signal line pattern is used to transmit an initialization signal. The initialization signal is a direct current signal with a steady electrical potential.

For example, the third electrical connection layer 75 and the initialization signal line pattern form an integral structure. In this setting manner, the third electrical connection layer 75 and the initialization signal line pattern may be formed simultaneously in a single patterning process, and may be directly coupled.

In the foregoing setting, the third electrical connection layer 75 is coupled to the initialization signal line patterns included in each sub-pixel in the corresponding sub-pixel group, such that the third electrical connection layer 75 may be coupled to four initialization signal line patterns included in the corresponding sub-pixel group simultaneously. By means of this setting manner, the third electrical connection layer 75 has the same steady electrical potential as the initialization signal line pattern. Thus, when a third electrical connection layer 75 with a large area is used to cover the gap between adjacent electrical connection elements, the operation stability of the display panel may be better ensured.

As shown in FIG. 10, in some embodiments, it may be set that an orthographic projection of the fourth electrical connection element 74 onto the substrate is between an orthographic projection of the first electrical connection element 71 onto the substrate and an orthographic projection of the second electrical connection element 72 onto the substrate; and an orthographic projection of the third electrical connection element 73 onto the substrate overlaps with the orthographic projection of the second electrical connection element 72 onto the substrate.

Specifically, in the sub-pixel, an orthographic projection of the second electrode plate onto the substrate is between an orthographic projection of the first reset signal line pattern 905 onto the substrate and an orthographic projection of the light emission control signal line pattern 903 onto the substrate, the foregoing setting that an orthographic projection of the fourth electrical connection element 74 onto the substrate is between an orthographic projection of the first electrical connection element 71 onto the substrate and an orthographic projection of the second electrical connection element 72 onto the substrate is more beneficial to the reduction of difficulties in arranging the first electrical connection element 71, the second electrical connection element 72 and the fourth electrical connection element 74.

By means of the foregoing setting that an orthographic projection of the third electrical connection element 73 onto the substrate overlaps with the orthographic projection of the second electrical connection element 72 onto the substrate, the layout space occupied by the second electrical connection element 72 and the third electrical portion together is reduced, thereby further improving the light transmittance of the display panel in the second pixel region.

In some embodiments, it may be set that an orthographic projection of the fourth electrical connection element 74 onto the substrate overlaps with an orthographic projection of the first electrical connection element 71 onto the substrate and an orthographic projection of the second electrical connection element 72 onto the substrate.

By means of the foregoing setting that an orthographic projection of the fourth electrical connection element 74 onto the substrate overlaps with an orthographic projection of the first electrical connection element 71 onto the substrate and an orthographic projection of the second electrical connection element 72 onto the substrate, the layout space occupied by the first electrical connection element 71, the second electrical connection element 72 and the fourth electrical connection element together is reduced, thereby further improving the light transmittance of the display panel in the second pixel region.

In some embodiments, an orthographic projection of the fourth electrical connection element 74 onto the substrate overlaps with an orthographic projection of the first electrical connection element 71 onto the substrate; and an orthographic projection of the third electrical connection element 73 onto the substrate overlaps with an orthographic projection of the second electrical connection element 72 onto the substrate.

By means of the setting that an orthographic projection of the fourth electrical connection element 74 onto the substrate overlaps with an orthographic projection of the first electrical connection element 71 onto the substrate; and an orthographic projection of the third electrical connection element 73 onto the substrate overlaps with an orthographic projection of the second electrical connection element 72 onto the substrate, the layout space occupied by the first electrical connection element 71, the second electrical connection element 72, the third electrical connection element 73 and the fourth electrical connection element together is reduced, thereby further improving the light transmittance of the display panel in the second pixel region.

As shown in FIG. 6 and FIG. 9, in some embodiments, the first electrical connection element 71, the second electrical connection element 72, and the fourth electrical connection elements 74 all include a first side portion, a second side portion and a middle portion between the first side portion and the second side portion; the middle portion extends in the first direction, the first side portion includes a portion extending in the first direction and a portion extending in the second direction, and the second side portion includes a portion extending in the first direction and a portion extending in the second direction;

the first gap is between the middle portion 713 of the first electrical connection element 71 and the middle portion 723 of the second electrical connection element 72, the first gap has a first width in a direction perpendicular to the first direction, and the first width is a minimum width satisfying an insulation condition between the middle portion 713 of the first electrical connection element 71 and the middle portion 723 of the second electrical connection element 72;

the second gap is between the middle portion of the third electrical connection element 73 and the middle portion 743 of the fourth electrical connection element 74, the second gap has a second width in a direction perpendicular to the first direction, and the second width is a minimum width satisfying an insulation condition between the middle portion of the third electrical connection element 73 and the middle portion 743 of the fourth electrical connection element 74.

Specifically, since the first electrical connection element 71 and the second electrical connection element 72 are disposed in the same layer and are correspondingly connected to signal line patterns used for transmitting different signals, a spacing needs to be provided between the first electrical connection element 71 and the second electrical connection element 72, to avoid a short circuit between the first electrical connection element 71 and the second electrical connection element 72.

Likewise, since the third electrical connection element 73 and the fourth electrical connection element 74 are disposed in the same layer and are correspondingly connected to signal line patterns used for transmitting different signals, a spacing needs to be provided between the third electrical connection element 73 and the fourth electrical connection element 74, to avoid a short circuit between the third electrical connection element 73 and the fourth electrical connection element 74.

By means of the foregoing setting that there is the first gap between the middle portion 713 of the first electrical connection element 71 and the middle portion 723 of the second electrical connection element 72 and there is the second gap between the middle portion of the third electrical connection element 73 and the middle portion 743 of the fourth electrical connection element 74, the first electrical connection element 71, the second electrical connection element 72, the third electrical connection element 73 and the fourth electrical connection element 74 can be arranged in a compact manner, thereby further improving the light transmittance of the display panel in the second pixel region.

In some embodiments, it may be set that the orthographic projection of the third electrical connection layer 75 onto the substrate overlaps with an orthographic projection of the first electrical connection element 71 onto the substrate, an orthographic projection of the second electrical connection element 72 onto the substrate, an orthographic projection of the third electrical connection element 73 onto the substrate, and an orthographic projection of the fourth electrical connection element 74 onto the substrate.

The foregoing setting manner enables a compact arrangement of the first electrical connection element 71, the second electrical connection element 72, the third electrical connection element 73 and the fourth electrical connection element 74, thereby further improving the light transmittance of the display panel in the second pixel region.

As shown in FIG. 4, in some embodiments, the first electrical connection element 71, the second electrical connection element 72, and the fourth electrical connection elements 74 all include a first side portion, a second side portion and a middle portion between the first side portion and the second side portion; the middle portion extends in the first direction, the first side portion includes a portion extending in the first direction and a portion extending in the second direction, and the second side portion includes a portion extending in the first direction and a portion extending in the second direction;

an orthographic projection of the middle portion included in the fourth electrical connection element 74 onto the substrate, an orthographic projection of the middle portion included in the first electrical connection element 71 onto the substrate, an orthographic projection of a third portion 733 of the third electrical connection element 73 onto the substrate, and an orthographic projection of the middle portion included in the second electrical connection element 72 onto the substrate are all within the orthographic projection of the third electrical connection layer 75 onto the substrate.

The foregoing setting manner enables a compact arrangement of the first electrical connection element 71, the second electrical connection element 72, the third electrical connection element 73, the fourth electrical connection element 74 and the third electrical connection layer 75, thereby further improving the light transmittance of the display panel in the second pixel region.

It is noted, in addition to the reduction of layout space of the electrical connection structure by setting the gap width and the overlapping relationship between different electrical connection elements, the line widths of the first electrical connection element 71, the second electrical connection element 72, the third electrical connection element 73, and the fourth electrical connection element 74 and the area of the third electrical connection layer 75 may be reduced as much as possible on the condition that function requirements are met, thereby further improving the light transmittance of the display panel in the second pixel region.

In some embodiments, it may be set that the sub-pixel further includes a data line pattern 908 extending in a second direction; the sub-pixel driver circuit includes a transistor structure and a storage capacitor, and the storage capacitor includes a first electrode plate and a second electrode plate arranged oppositely; the first electrical connection layer and a gate electrode of the transistor structure are arranged in a same layer and are made of a same material; the second electrical connection layer and the data line pattern 908 are arranged in a same layer and are made of a same material; the third electrical connection layer 75 and the second electrode plate are arranged in a same layer and are made of a same material.

Since the first electrical connection layer and a gate electrode of the transistor structure are arranged in a same layer and are made of a same material, the first electrical connection layer and a gate electrode of the transistor structure can be formed in one and the same patterning process; since the second electrical connection layer and the data line pattern 908 are arranged in a same layer and are made of a same material, the second electrical connection layer and the data line pattern 908 can be formed in one and the same patterning process; since the third electrical connection layer 75 and the second electrode plate are arranged in a same layer and are made of a same material, the third electrical connection layer 75 and the second electrode plate can be formed in one and the same patterning process; thereby further simplifying the manufacturing process flow of the display panel and reducing manufacturing costs.

In some embodiments, it may be set that the sub-pixel further includes a data line pattern 908 extending in a second direction; the sub-pixel driver circuit includes a transistor structure and a storage capacitor, and the storage capacitor includes a first electrode plate and a second electrode plate arranged oppositely; the first electrical connection layer and the second electrode plate are arranged in a same layer and are made of a same material; the second electrical connection layer and the data line pattern 908 are arranged in a same layer and are made of a same material; the third electrical connection layer 75 and a gate electrode of the transistor structure are arranged in a same layer and are made of a same material.

Since the first electrical connection layer and the second electrode plate are arranged in a same layer and are made of a same material, the first electrical connection layer and the second electrode plate can be formed in one and the same patterning process; since the second electrical connection layer and the data line pattern 908 are arranged in a same layer and are made of a same material, the second electrical connection layer and the data line pattern 908 can be formed in one and the same patterning process; since the third electrical connection layer 75 and a gate electrode of the transistor structure are arranged in a same layer and are made of a same material, the third electrical connection layer 75 and a gate electrode of the transistor structure can be formed in one and the same patterning process; thereby further simplifying the manufacturing process flow of the display panel and reducing manufacturing costs.

In some embodiments, the first signal line pattern includes a first reset signal line pattern, the second signal line pattern includes a light emission control signal line pattern, and the third signal line pattern includes a gate line pattern and a second reset signal line pattern; the sub-pixel further includes a power signal line pattern, a data line pattern, a first initialization signal line pattern and a second initialization signal line pattern;

the sub-pixel driver circuit includes: a storage capacitor, a driver transistor, a first transistor, a second transistor, a fourth transistor, a fifth transistor, a sixth transistor and a seventh transistor;

a gate electrode of the driver transistor is coupled to a second electrode of the first transistor, a first electrode of the driver transistor is coupled to a second electrode of the fifth transistor, a second electrode of the driver transistor is coupled to a first electrode of the first transistor;

a gate electrode of the first transistor is coupled to the gate line pattern;

a gate electrode of the second transistor is coupled to the first reset signal line pattern, a first electrode of the second transistor is coupled to the first initialization signal line pattern, a second electrode of the second transistor is coupled to the gate electrode of the driver transistor;

a gate electrode of the fourth transistor is coupled to the gate line pattern, a first electrode of the fourth transistor is coupled to the data line pattern, a second electrode of the fourth transistor is coupled to the first electrode of the driver transistor;

a gate electrode of the fifth transistor is coupled to the light emission control signal line pattern, a first electrode of the fifth transistor is coupled to the power signal line pattern;

a gate electrode of the sixth transistor is coupled to the light emission control signal line pattern, a first electrode of the sixth transistor is coupled to the second electrode of the driver transistor, a second electrode of the sixth transistor is coupled to a corresponding light emitting device in the display panel;

a second electrode of the seventh transistor is coupled to the corresponding light emitting device, a gate electrode of the seventh transistor is coupled to the second reset signal line pattern, a first electrode of the seventh transistor is coupled to the second initialization signal line pattern.

Specifically, as shown in FIG. 1, FIG. 4 and FIG. 10, multiple sub-pixel driver circuits included in the display panel may be divided into multiple rows of sub-pixel driver circuits arranged sequentially in the second direction, and multiple columns of sub-pixel driver circuits arranged sequentially in the first direction. The first initialization signal line patterns 904 corresponding to the sub-pixel driver circuits belonging to the same pixel unit are electrically connected sequentially to form an integral structure. The second initialization signal line patterns 904' corresponding to the sub-pixel driver circuits belonging to the same pixel unit are electrically connected sequentially to form an integral structure. The gate line patterns 902 corresponding to the sub-pixel driver circuits belonging to the same pixel unit are electrically connected sequentially to form an integral structure. The light emission control signal line patterns 903 corresponding to the sub-pixel driver circuits belonging to the same pixel unit are electrically connected sequentially to form an integral structure. The first reset signal line patterns 905 corresponding to the sub-pixel driver circuits belonging to the same pixel unit are electrically connected sequentially to form an integral structure. The second reset signal line patterns 905' corresponding to the sub-pixel driver circuits belonging to the same pixel unit are electrically connected sequentially to form an integral structure. The data line patterns 908 corresponding to the sub-pixel driver circuits in the same column are electrically connected sequentially to form an integral structure. The power signal line patterns 901 corresponding to the sub-pixel driver circuits in the same column are electrically connected sequentially to form an integral structure.

As shown in FIG. 1, FIG. 4 and FIG. 10, taking a sub-pixel driver circuit for example, the sub-pixel driver circuit includes seven thin-film transistors and one capacitor. Each of the transistors included in the sub-pixel driver circuit is a P-type transistor. A first transistor T1 is of a double-gate structure, a gate electrode 201g of the first transistor T1 is coupled to the gate line pattern 902, a source electrode S1 of the first transistor T1 is coupled to a drain electrode D3 of a third transistor T3 (i.e., a driver transistor), a drain electrode D1 of the first transistor T1 is coupled to a gate electrode 203g of the third transistor T3.

A second transistor T2 is of a double-gate structure, a gate electrode 202g of the second transistor T2 is coupled to the first reset signal line pattern 905, a source electrode S2 of the second transistor T2 is coupled to the first initialization signal line pattern 904, a drain electrode D2 of the second transistor T2 is coupled to the gate electrode 203g of the third transistor T3.

A gate electrode 204g of the fourth transistor T4 is coupled to the gate line pattern 902, a source electrode S4 of the fourth transistor T4 is coupled to the data line pattern 908, a drain electrode D4 of the fourth transistor T4 is coupled to a source electrode S3 of the third transistor T3.

A gate electrode 205g of the fifth transistor T5 is coupled to the light emission control signal line pattern 903, a source electrode S5 of the fifth transistor T5 is coupled to the power signal line pattern 901, a drain electrode D5 of the fifth transistor T5 is coupled to the source electrode S3 of the third transistor T3.

A gate electrode 206g of the sixth transistor T6 is coupled to the light emission control signal line pattern 903, a source electrode S6 of the sixth transistor T6 is coupled to a drain electrode D3 of the third transistor T3, a drain electrode D6 of the sixth transistor T6 is coupled to the corresponding light emitting device in the display panel.

A gate electrode 207g of the seventh transistor T7 is coupled to the second reset signal line pattern 905', a drain electrode D7 of the seventh transistor T7 is coupled to the light emitting device, a source electrode S7 of the seventh transistor T7 is coupled to the second initialization signal line pattern 904'.

The first electrode plate Cst1 of the storage capacitor Cst is reused as the gate electrode 203g of the third transistor T3, and the second electrode plate Cst2 of the storage capacitor Cst is coupled to the power signal line pattern 901.

Figure 2:
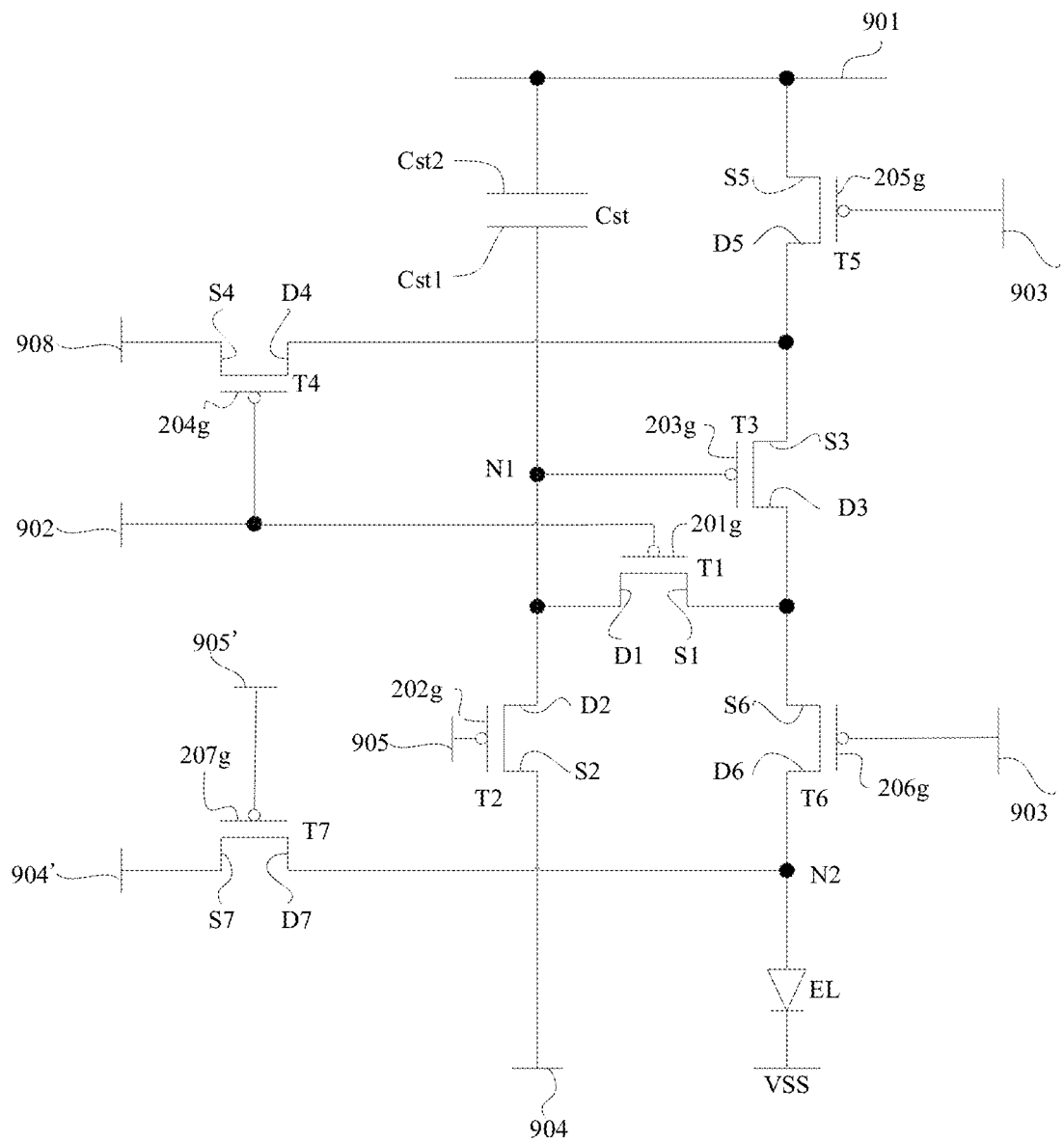
FIG. 2 is a circuit diagram of a sub-pixel driver circuit according to an embodiment of the present disclosure.
Figure 3:
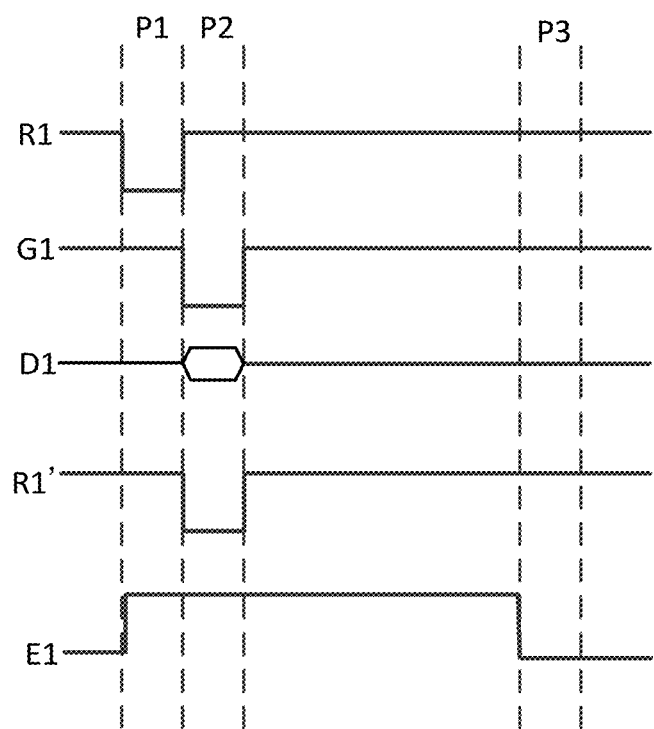
FIG. 3 is a sequence diagram of a sub-pixel driver circuit according to an embodiment of the present disclosure.

As shown in FIG. 2 and FIG. 3, when the display sub-pixel driver circuit of the foregoing structure is in operation, each duty cycle includes a reset period P1, a write compensation period P2 and light emission period P3. In FIG. 3, E1 represents the light emission control signal transmitted on the light emission control signal line pattern 903 of the current sub-pixel, R1 represents the reset signal transmitted on the first reset signal line pattern 905 of the current sub-pixel, D1 represents the data signal transmitted on the data line pattern 908 of the current sub-pixel, G1 represents the gate scanning signal transmitted on the gate line pattern 902 of the current sub-pixel, and R1' represents the reset signal transmitted on the second reset signal line pattern 905' of the current sub-pixel. When the display panel function is in operation, a line-by-line scanning is performed from bottom to top.

In the first reset period P1, the reset signal input from the first reset signal line pattern 905 is in an active electrical level, the second transistor T2 is turned on and transmits the initialization signal input from the first initialization signal line pattern 904' to the gate electrode 203g of the third transistor T3, such that a gate-source voltage Vgs maintained on the third transistor T3 in the previous frame is removed, to reset the gate electrode 203g of the third transistor T3.

In the write compensation period P2, the reset signal input from the first reset signal line pattern 905 is in a non-active electrical level, the second transistor T2 is turned off, the gate scanning signal input from the gate line pattern 902 is in an active electrical level to turn on the first transistor T1 and the fourth transistor T4, and the data signal is input from the data line pattern 908 and is transmitted to the source electrode S3 of the third transistor T3 via the fourth transistor T4. Meanwhile, since the first transistor T1 and the fourth transistor T4 are turned on, the third transistor T3 is formed into a diode structure. As a result, the first transistor T1, the third transistor T3 and the fourth transistor T4 operate in conjunction to perform a threshold voltage compensation on the third transistor T3. If the compensation is performed long enough, the electrical potential on the gate electrode 203g of the third transistor T3 can be controlled to finally reach Vdata+Vth, where Vdata represents the data signal voltage value, and Vth represents the threshold voltage of the third transistor T3.

In the write compensation period P2, the reset signal input from the second reset signal line pattern 905' is in an active electrical level to turn on the seventh transistor T7, and the initialization signal transmitted by the second initialization signal line pattern 904' is input to the anode of the light emitting device EL, so that the light emitting device EL does not emit light.

In the light emission period P3, the light emission control signal input from the light emission control signal line pattern 903 is in an active electrical level to turn on the fifth transistor T5 and the sixth transistor T6, such that the power signal transmitted by the power signal line pattern 901 is input to the source electrode S3 of the third transistor T3, meanwhile, since the gate electrode 203g of the third transistor T3 is maintained at Vdata+Vth, the third transistor T3 is turned on and the gate-source voltage corresponding to the third transistor T3 is Vdata+Vth−VDD, where VDD is the voltage value corresponding to the power signal. The drain current resulting from the gate-source voltage flows to the anode of the corresponding light emitting device EL, to drive the corresponding light emitting device EL to emit light.

As shown in FIGS. 4 to 7, during manufacturing the foregoing display sub-pixel driver circuit, the films and layers corresponding to the display sub-pixel driver circuit are arranged as follows:

An active film layer, a gate insulation layer, a first gate metal layer, a first interlayer insulation layer, a second gate metal layer, a second interlayer insulation layer, a first source-drain metal layer and a third interlayer insulation layer are sequentially stacked in a direction away from the substrate.

Figure 5:
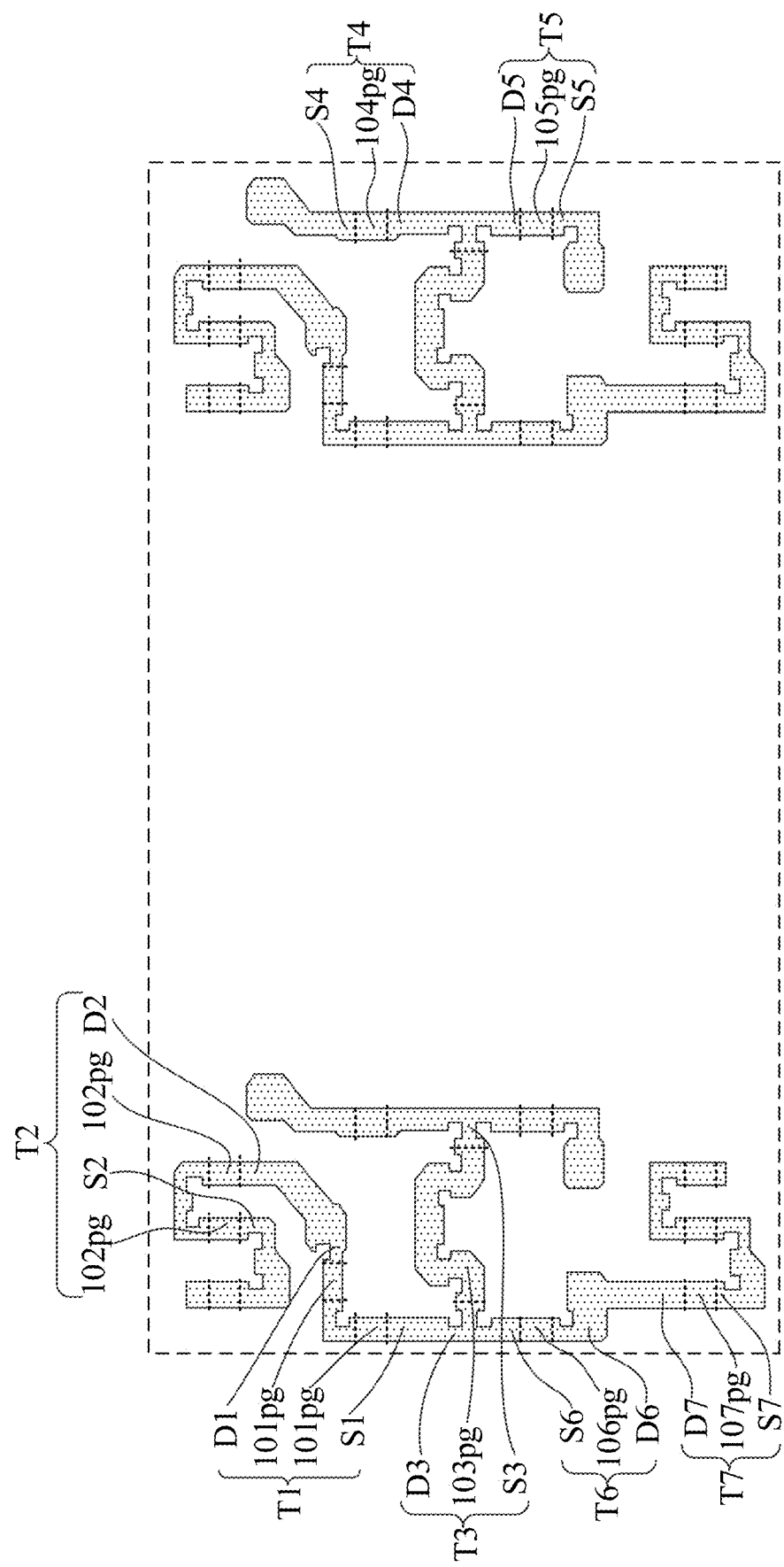
FIG. 5 is a schematic diagram of a layout of an active layer in the FIG. 4.

As shown in FIG. 5, the active film layer is used to form the channel regions (e.g., 101pg to 107pg), the source forming regions and the drain forming regions of the transistors in the display sub-pixel driver circuit. The active film layer corresponding to the source forming region and the drain forming region has electrical conductivity superior to that of the active film layer corresponding to the channel region due to doping effect. The active film layer may be made of amorphous silicon, polysilicon, oxide semiconductor material or the like. It is noted, the source electrode region and the drain electrode region may be an n-type doped region or a p-type doped region.

Further, it is noted, the active film layer corresponding to the source forming region and the drain forming region may directly act as the corresponding source electrodes (e.g., S1 to S7) and drain electrodes (e.g., D1 to D7); or a metal material may be used to manufacture the source electrode in contact with the source forming region and a metal material may be used to manufacture the drain electrode in contact with the drain forming region.

As shown in FIG. 6, the first gate metal layer is used to form the gate electrodes (e.g., 201g to 207g) of the transistors in the sub-pixel driver circuit, and structures included in the display panel, such as the gate line patterns 902, the light emission control signal line patterns 903 and the reset signal line patterns 905. The gate electrode 203g of the third transistor T3 of each sub-pixel driver circuit is reused as the first electrode plate Cst1 of the second storage capacitor Cst in the sub-pixel driver circuit.

As shown in FIG. 7, the second gate metal layer is used to form the second electrode plates Cst2 of the second storage capacitors Cst, and the first initialization signal line patterns 904 and the second initialization signal line patterns 904' included in the display substrate.

As shown in FIG. 8, the first source-drain metal layer is used to form the data line patterns 908, the power signal line patterns 901 and some electrical connection elements included in the display panel.

To be more specific, continuing referring to FIGS. 4 to 5, the gate electrode 201g of the first transistor T1 covers the first channel region 101pg, the gate electrode 202g of the second transistor T2 covers the second channel region 102pg, the gate electrode 203g of the third transistor T3 covers the third channel region 103pg, the gate electrode 204g of the fourth transistor T4 covers the fourth channel region 104pg, the gate electrode 205g of the fifth transistor T5 covers the fifth channel region 105pg, the gate electrode 206g of the sixth transistor T6 covers the sixth channel region 106pg, and the gate electrode 207g of the seventh transistor T7 covers the seventh channel region 107pg. The gate electrode 203g of the third transistor T3 is reused as the first electrode plate Cst1 of the storage capacitor Cst, and the second electrode plate Cst2 of the storage capacitor Cst is coupled to the power signal line pattern 901.

Further, as shown in FIG. 4, in the display panel according to the present disclosure, in the second direction (e.g., Y direction), the gate electrode 204g of the fourth transistor T4, the gate electrode 201g of the first transistor T1 and the gate electrode 202g of the second transistor T2 are all on the first side of the gate electrode of the driver transistor (i.e., the gate electrode 203g of the third transistor T3), and the gate electrode of the seventh transistor T7, the gate electrode 206g of the sixth transistor T6 and the gate electrode of the fifth transistor T5 are all on the second side of the gate electrode of the driver transistor. For example, the first and second sides of the gate electrode of the driver transistor are opposite sides in the second direction. Further, the first side of the gate electrode of the driver transistor may be a lower side of the gate electrode of the driver transistor, and the second side of the gate electrode of the driver transistor may be an upper side of the gate electrode of the driver transistor. As for the lower side, for example, a side of the display panel used for bonding IC is the lower side of the display panel, and the lower side of the gate electrode of the driver transistor is the side of the gate electrode of the driver transistor that is closer to the IC. The upper side is the opposite side of the lower side, for example, the side of the gate electrode of the driver transistor that is remoter from the IC.

In the first direction (e.g., X direction), the gate electrode 204g of the fourth transistor T4 and the gate electrode 205g of the fifth transistor T5 are all on the third side of the gate electrode of the driver transistor, and the gate electrode 201g of the first transistor T1 and the gate electrode 206g of the sixth transistor T6 are all on the fourth side of the gate electrode of the driver transistor. For example, the third and fourth sides of the gate electrode of the driver transistor are opposite sides in the first direction. Further, the third side of the gate electrode of the driver transistor may be a right side of the gate electrode of the driver transistor, and the fourth side of the gate electrode of the driver transistor may be a left side of the gate electrode of the driver transistor. As for the left and right sides, for example, in the same sub-pixel, the data line pattern 908 is on the right side of the power signal line pattern 901, and the power signal line pattern 901 is on the left side of the data line pattern 908.

An embodiment of the present disclosure further provides a display device. The display device includes the display panel according to the foregoing embodiment.

In the display panel according to the foregoing embodiment, an electrical connection structure is provided between two sub-pixels included in the sub-pixel group. The electrical connection structure includes: a first electrical connection layer, a second electrical connection layer and a third electrical connection layer 75 disposed in different layers. The first electrical connection layer and the second electrical connection layer are used to couple together the signal line patterns which are used for transmitting the same signal and are included in the sub-pixels in the sub-pixel group, and the third electrical connection layer 75 is used to couple together the fifth signal line patterns 85 which are used for transmitting the fifth signal with the fixed electrical potential and are included in the sub-pixels in the sub-pixel group. Therefore, by configuring the electrical connection structure in the display panel according to the foregoing embodiment, it can be achieved that the signal line patterns which are used for transmitting the same signal and are included in the sub-pixels in the sub-pixel group are correspondingly coupled together.

Further, in the display panel according to the foregoing embodiment, by means of the setting that the orthographic projection of the third electrical connection layer 75 onto a substrate of the display panel covers at least part of an orthographic projection of the first gap onto the substrate and at least part of an orthographic projection of the second gap onto the substrate, the third electrical connection layer 75 may cover the gap between adjacent electrical connection elements between two sub-pixels in the sub-pixel group, thereby reducing the light leakage at the gap, preventing the interfering diffraction, glare and the like arising when the light passes through the gap, and better ensuring the imaging quality of the camera in the display panel when a picture is taken.

In addition, in the display panel according to the foregoing embodiment, the third electrical connection layer 75 is coupled to the fifth signal line pattern 85 used for transmitting the fifth signal with the fixed electrical potential, such that the third electrical connection layer 75 has a steady electrical potential and has no significant effect on the RC loading of the fifth signal line pattern 85.

Therefore, when including the foregoing display panel, the display device according to the embodiment of the present disclosure also has the abovementioned beneficial effects, which are not described in detail again.

It is noted, the display device may be any product or component has a display function, such as a TV, a display, a digital photo frame, a cell phone, or a tablet computer.

An embodiment of the present disclosure further provides a method for manufacturing a display panel. The method is used to manufacture the display panel according to the foregoing embodiment. The display panel includes a first pixel region and a second pixel region, a pixel density of the second pixel region being lower than a pixel density of the first pixel region. The method includes:

manufacturing a plurality of pixel units arranged in array and a plurality of electrical connection structures in the second pixel region;

where the plurality of pixel units form a plurality of pixel unit rows and each pixel unit row includes multiple pixel units arranged in a first direction; each of the pixel units includes multiple sub-pixels arranged in the first direction, and two sub-pixels that are closest to each other and belong respectively to two adjacent pixel units in a same pixel unit row form a sub-pixel group; the sub-pixel includes: a sub-pixel driver circuit, and a first to fifth signal line patterns coupled to the sub-pixel driver circuit;

the plurality of electrical connection structures are corresponding to the sub-pixel groups respectively, where the electrical connection structure is between two sub-pixels included in the corresponding sub-pixel group, and the electrical connection structure includes a first electrical connection layer, a second electrical connection layer and a third electrical connection layer disposed in different layers;

the first electrical connection layer includes a first electrical connection element and a second electrical connection element, and there is a first gap between the first and second electrical connection elements; the first electrical connection element is coupled to the first signal line pattern included in each sub-pixel in the corresponding sub-pixel group, and the second electrical connection element is coupled to the second signal line pattern included in each sub-pixel in the corresponding sub-pixel group;

the second electrical connection layer includes a third electrical connection element and at least one fourth electrical connection element, and there is a second gap between the third and fourth electrical connection elements that are adjacent; the third electrical connection element is coupled to the third signal line pattern included in each sub-pixel in the corresponding sub-pixel group, the at least one fourth electrical connection element respectively corresponds to the fourth signal line patterns included in both the sub-pixels in the corresponding sub-pixel group and each of the at least one fourth electrical connection element is coupled to the corresponding fourth signal line pattern;

the third electrical connection layer is coupled to the fifth signal line pattern included in each sub-pixel in the corresponding sub-pixel group, the fifth signal line pattern is used to transmit a fifth signal with a fixed electrical potential, and an orthographic projection of the third electrical connection layer onto a substrate of the display panel covers at least part of an orthographic projection of the first gap onto the substrate and at least part of an orthographic projection of the second gap onto the substrate.

In the display panel manufactured by using the method according to the embodiment of the present disclosure, an electrical connection structure is provided between two sub-pixels included in the sub-pixel group. The electrical connection structure includes: a first electrical connection layer, a second electrical connection layer and a third electrical connection layer 75 disposed in different layers. The first electrical connection layer and the second electrical connection layer are used to couple together the signal line patterns which are used for transmitting the same signal and are included in the sub-pixels in the sub-pixel group, and the third electrical connection layer 75 is used to couple together the fifth signal line patterns 85 which are used for transmitting the fifth signal with the fixed electrical potential and are included in the sub-pixels in the sub-pixel group. Therefore, by configuring the electrical connection structure in the display panel manufactured by using the method according to the embodiment of the present disclosure, it can be achieved that the signal line patterns which are used for transmitting the same signal and are included in the sub-pixels in the sub-pixel group are correspondingly coupled together.

Further, in the display panel manufactured by using the method according to the embodiment of the present disclosure, by means of the setting that the orthographic projection of the third electrical connection layer 75 onto a substrate of the display panel covers at least part of an orthographic projection of the first gap onto the substrate and at least part of an orthographic projection of the second gap onto the substrate, the third electrical connection layer 75 may cover the gap between adjacent electrical connection elements between two sub-pixels in the sub-pixel group, thereby reducing the light leakage at the gap, preventing the interfering diffraction, glare and the like arising when the light passes through the gap, and better ensuring the imaging quality of the camera in the display panel when a picture is taken.

In addition, in the display panel manufactured by using the method according to the embodiment of the present disclosure, the third electrical connection layer 75 is coupled to the fifth signal line pattern 85 used for transmitting the fifth signal with the fixed electrical potential, such that the third electrical connection layer 75 has a steady electrical potential and has no significant effect on the RC loading of the fifth signal line pattern 85.

It is noted, the embodiments provided in the specification are described in a progressive manner and the description of each embodiment focuses on its difference from other embodiments, thus the same or similar part among various embodiments may be referred to each other. In particular, for method embodiments, since they are essentially similar to the product embodiments, description of the method embodiments is relatively simple. For a relevant description, reference may be made to the description of the product embodiments.

It is understood by persons skilled in the art that, unless defined otherwise, all technical and scientific terms used herein have the same meaning as commonly understood by one of ordinary skill in the art to which this application belongs. Terms "first", "second" and the like in this disclosure are adopted not to describe a specific sequence, quantity or importance, but to distinguish different components. Term "include", "have" or any variant thereof refers to that an element or object preceding the term covers elements or objects and equivalents thereof listed behind the term, and does not preclude other elements or objects. The term "connection", "couple", "connected" or the like is not intended to be limited to a physical or mechanical connection. Rather, an electrical connection, whether direct or indirect, is encompassed. The terms "upper", "lower", "left", "right" and the like are merely used to denote a relative positional relationship. When the absolute position of a described object changes, the relative positional relationship may change accordingly.

It will be understood that when an element, such as a layer, a film, a region or a substrate, is referred to as being "above" or "below" another element, it can be "directly above" or "directly below" the other element or intervening elements may also be present.

In the description of the foregoing implementations, specific characteristics, structures, materials or features may be combined in appropriate manner in any one or more embodiments or examples.

The aforementioned are merely specific implementations of the present disclosure, but the scope of the disclosure is by no means limited thereto. Any modifications or replacements that would easily occurred to those skilled in the art, without departing from the technical scope disclosed in the disclosure, should be encompassed in the scope of the present disclosure. Therefore, the scope of the present disclosure shall be determined by the scope of the claims.

What is claimed is:

1. A display panel, comprising a first pixel region and a second pixel region, wherein a pixel density of the second pixel region is lower than a pixel density of the first pixel region; the second pixel region comprises a plurality of pixel units arranged in array, each of the plurality of pixel units comprises a plurality of sub-pixels, and two sub-pixels that are closest to each other and belong respectively to two adjacent pixel units form a sub-pixel group; each of the plurality of sub-pixels comprises: a sub-pixel driver circuit, and a first signal line pattern, a third signal line pattern, a fourth signal line pattern and a fifth signal line pattern coupled to the sub-pixel driver circuit;

the display panel further comprises a plurality of electrical connection structures corresponding to sub-pixel groups respectively, wherein each of the plurality of electrical connection structures is between two sub-pixels comprised in a corresponding one of the sub-pixel groups, and each of the plurality electrical connection structures comprises a first electrical connection layer, a second electrical connection layer and a third electrical connection layer disposed in different layers;

the first electrical connection layer comprises a first electrical connection element; the first electrical connection element is coupled to the first signal line pattern comprised in each sub-pixel in the corresponding sub-pixel group;

the second electrical connection layer comprises a third electrical connection element and at least one fourth electrical connection element, and there is a second gap between the third electrical connection element and the fourth electrical connection element that are adjacent; the third electrical connection element is coupled to the third signal line pattern comprised in each sub-pixel in the corresponding sub-pixel group, the at least one fourth electrical connection element respectively corresponds to the fourth signal line patterns comprised in the two sub-pixels in the corresponding sub-pixel group, and each of the at least one fourth electrical connection element is coupled to a corresponding one of the fourth signal line patterns;

the third electrical connection layer is coupled to the fifth signal line pattern comprised in each sub-pixel in the corresponding sub-pixel group, the fifth signal line pattern is used to transmit a fifth signal with a fixed electrical potential, and an orthographic projection of the third electrical connection layer onto a substrate of the display panel covers and at least part of an orthographic projection of the second gap onto the substrate;

wherein the fourth signal line pattern comprises an initialization signal line pattern.

2. The display panel according to claim 1, wherein two sub-pixels of the sub-pixel groups are arranged in a first direction.

3. The display panel according to claim 1, wherein, the sub-pixel driver circuit comprises a storage capacitor, the storage capacitor comprises a first electrode plate and a second electrode plate arranged oppositely, and the first electrode plate is between the substrate and the second electrode plate;

at least part of the fifth signal line pattern extends in a second direction, and the first direction intersects with the second direction.

4. The display panel according to claim 1, wherein, an orthographic projection of the first electrical connection element onto the substrate overlaps with an orthographic projection of the fourth electrical connection element onto the substrate.

5. The display panel according to claim 1, wherein, the sub-pixel driver circuit comprises a storage capacitor, the storage capacitor comprises a first electrode plate and a second electrode plate arranged oppositely in a direction perpendicular to the substrate, and the first electrode plate is between the substrate and the second electrode plate;

the fourth signal line pattern comprises a power signal line pattern, at least part of the power signal line pattern extends in a second direction, and the second electrode plate and the power signal line pattern are coupled to each other;

the second electrical connection layer comprises one fourth electrical connection element, and the fourth electrical connection element is coupled to the second electrode plate comprised in each sub-pixel in the corresponding sub-pixel group.

6. The display panel according to claim 5, wherein, the fifth signal line pattern comprises an initialization signal line pattern, and the third electrical connection layer is coupled to the initialization signal line pattern comprised in each sub-pixel in the corresponding sub-pixel group.

7. The display panel according to claim 1, wherein the sub-pixel driver circuit comprises a transistor structure and a storage capacitor, and the storage capacitor comprises a first electrode plate and a second electrode plate arranged oppositely;

the first electrical connection layer and a gate electrode of the transistor structure are arranged in a same layer and are made of a same material.

8. The display panel according to claim 1, wherein, one of the sub-pixels comprises a first reset signal line pattern, a light emission control signal line pattern, a gate line pattern and a second reset signal line pattern, a power signal line pattern, a data line pattern, a first initialization signal line pattern and a second initialization signal line pattern;

the sub-pixel driver circuit comprises: a storage capacitor, a driver transistor, a first transistor, a second transistor, a fourth transistor, a fifth transistor, a sixth transistor and a seventh transistor;

a gate electrode of the driver transistor is coupled to a second electrode of the first transistor, a first electrode of the driver transistor is coupled to a second electrode of the fifth transistor, a second electrode of the driver transistor is coupled to a first electrode of the first transistor;

a gate electrode of the first transistor is coupled to the gate line pattern;

a gate electrode of the second transistor is coupled to the first reset signal line pattern, a first electrode of the second transistor is coupled to the first initialization signal line pattern, a second electrode of the second transistor is coupled to the gate electrode of the driver transistor;

a gate electrode of the fifth transistor is coupled to the light emission control signal line pattern, a first electrode of the fifth transistor is coupled to the power signal line pattern;

a gate electrode of the sixth transistor is coupled to the light emission control signal line pattern, a first electrode of the sixth transistor is coupled to the second electrode of the driver transistor, a second electrode of the sixth transistor is coupled to a corresponding light emitting device in the display panel;

a second electrode of the seventh transistor is coupled to the corresponding light emitting device, a gate electrode of the seventh transistor is coupled to the second reset signal line pattern, a first electrode of the seventh transistor is coupled to the second initialization signal line pattern.

9. A display device, comprising the display panel according to claim 1.

* * * * *